(12) United States Patent
Shibata et al.

(10) Patent No.: US 9,478,554 B2
(45) Date of Patent: Oct. 25, 2016

(54) SEMICONDUCTOR DEVICE AND METHOD OF MANUFACTURING SEMICONDUCTOR DEVICE

(71) Applicant: RENESAS ELECTRONICS CORPORATION, Tokyo (JP)

(72) Inventors: Ken Shibata, Kanagawa (JP); Yuta Yanagitani, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/990,262

(22) Filed: Jan. 7, 2016

(65) Prior Publication Data

US 2016/0118389 A1    Apr. 28, 2016

Related U.S. Application Data

(62) Division of application No. 14/234,479, filed as application No. PCT/JP2011/067478 on Jul. 29, 2011, now Pat. No. 9,245,614.

(51) Int. Cl.

| | |
|---|---|
| *H01L 21/84* | (2006.01) |
| *H01L 27/11* | (2006.01) |
| *H01L 27/02* | (2006.01) |
| *H01L 21/8238* | (2006.01) |

(Continued)

(52) U.S. Cl.
CPC ............. *H01L 27/1104* (2013.01); *G11C 5/14* (2013.01); *G11C 11/412* (2013.01); *G11C 11/417* (2013.01); *G11C 11/419* (2013.01); *H01L 21/823892* (2013.01); *H01L 27/0207* (2013.01); *H01L 27/092* (2013.01); *H01L 27/1116* (2013.01)

(58) Field of Classification Search
USPC .......................... 438/197, 164, 57; 257/390
See application file for complete search history.

(56) References Cited

U.S. PATENT DOCUMENTS

| | | | |
|---|---|---|---|
| 5,604,697 | A | 2/1997 | Takahashi et al. |
| 5,777,927 | A | 7/1998 | Takahashi et al. |

(Continued)

FOREIGN PATENT DOCUMENTS

| | | |
|---|---|---|
| JP | 08-181292 A | 7/1996 |
| JP | 11-54726 A | 2/1999 |

(Continued)

OTHER PUBLICATIONS

Japanese Office action received in corresponding Japanese Application No. 2014-198824 dated Aug. 4, 2015.

*Primary Examiner* — Vu Le
(74) *Attorney, Agent, or Firm* — Mattingly & Malur, PC

(57) ABSTRACT

A semiconductor device having a high degree of freedom of layout has a first part AR1, in which a plurality of p-type wells PW and n-type wells NW are alternately arranged to be adjacent to each other along an X-axis direction. A common power feeding region (ARP2) for the plurality of wells PW is arranged on one side so as to interpose the AR1 in a Y-axis direction, and a common power feeding region (ARN2) for the plurality of wells NW is arranged on the other side. In the power feeding region (ARP2) for the PW wells, a p$^+$-type power-feeding diffusion layer P+(DFW) having an elongate shape extending in the X-axis direction is formed. A plurality of gate layers GT extending in the X-axis direction to cross the boundary between the PW and NW wells are arranged in the AR1, and a plurality of MIS transistors are correspondingly formed.

3 Claims, 29 Drawing Sheets

(51) Int. Cl.
*H01L 27/092* (2006.01)
*G11C 11/412* (2006.01)
*G11C 5/14* (2006.01)
*G11C 11/417* (2006.01)
*G11C 11/419* (2006.01)

(56) References Cited

U.S. PATENT DOCUMENTS

| | | | |
|---|---|---|---|
| 5,966,341 | A | 10/1999 | Takahashi et al. |
| RE38,944 | E | 1/2006 | Takahashi et al. |
| RE40,356 | E | 6/2008 | Takahashi et al. |
| RE41,379 | E | 6/2010 | Takahashi et al. |
| RE42,659 | E | 8/2011 | Takahashi et al. |
| 8,169,047 | B2 | 5/2012 | Kato |
| 2003/0067819 | A1 | 4/2003 | Satomi et al. |
| 2004/0252548 | A1 | 12/2004 | Tsukamoto et al. |
| 2007/0263428 | A1 | 11/2007 | Ishii |
| 2009/0065874 | A1 | 3/2009 | Ishii |
| 2009/0121311 | A1* | 5/2009 | Okamoto ........ H01L 21/823878 257/520 |
| 2010/0246236 | A1 | 9/2010 | Ishii |
| 2011/0096586 | A1 | 4/2011 | Ishii |
| 2012/0168875 | A1 | 7/2012 | Tamaru et al. |

FOREIGN PATENT DOCUMENTS

| | | |
|---|---|---|
| JP | 2003-115551 A | 4/2003 |
| JP | 2004-303340 A | 10/2004 |
| JP | 2006-19647 A | 1/2006 |
| JP | 2007-205787 A | 11/2007 |
| JP | 2010-74023 A | 4/2010 |
| WO | 2011/077664 A1 | 6/2011 |

* cited by examiner

FIG. 7
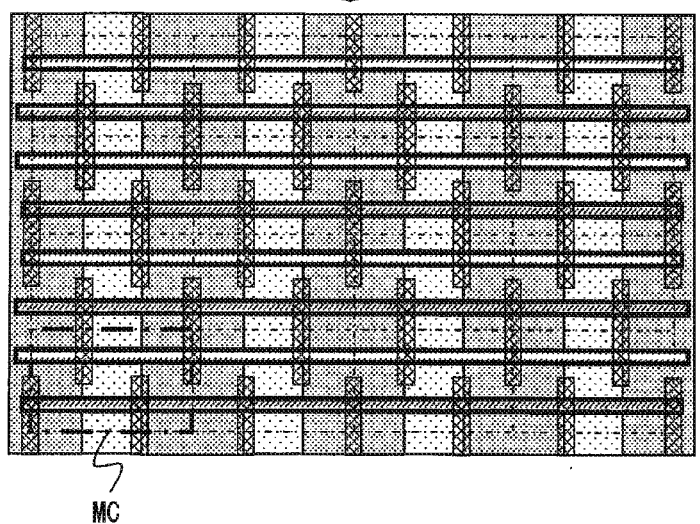
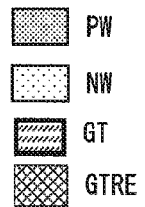
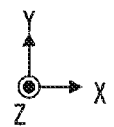

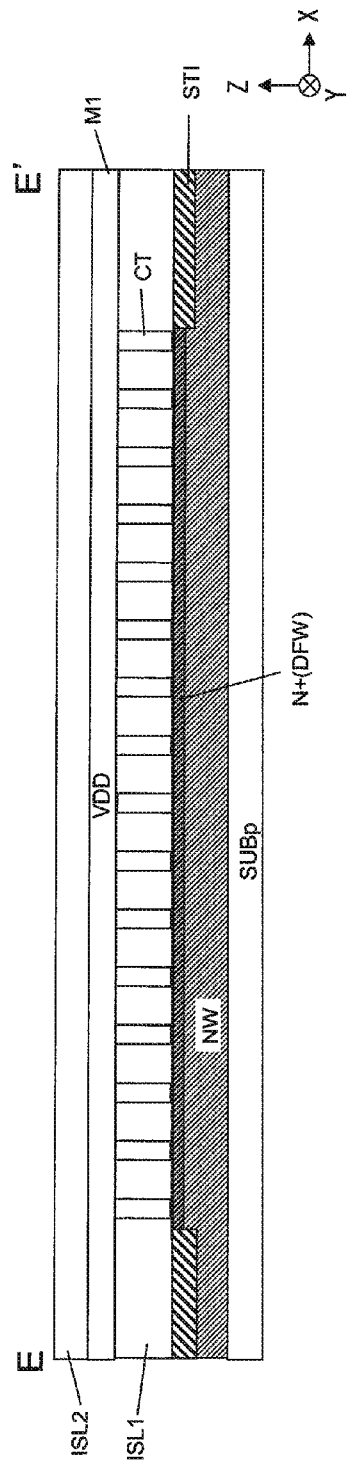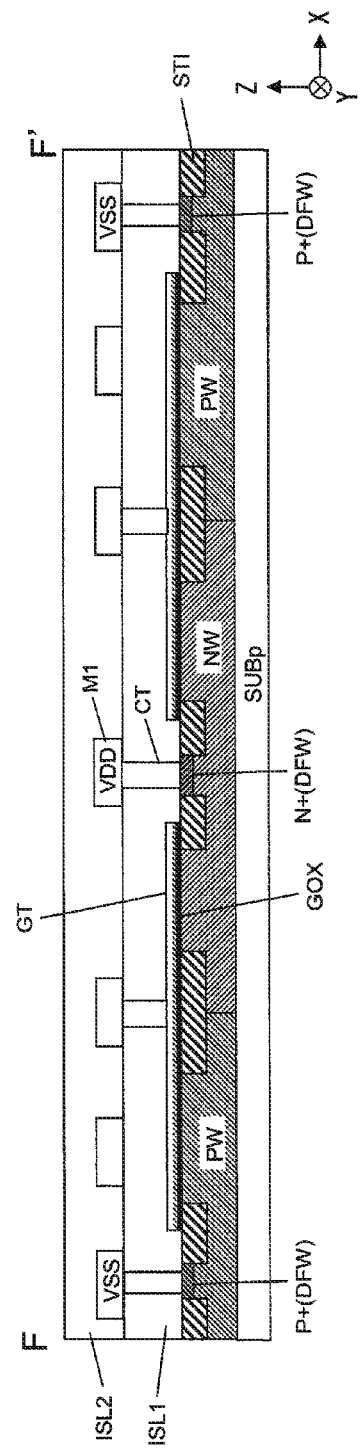

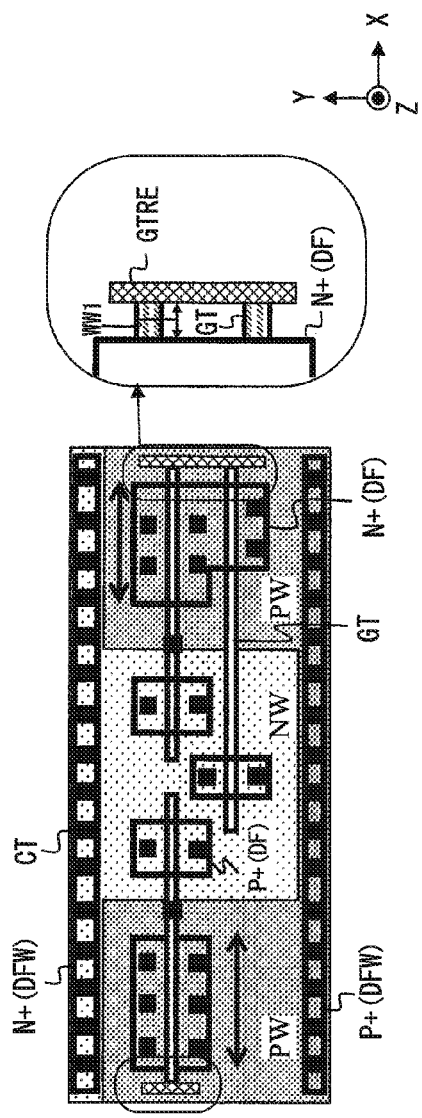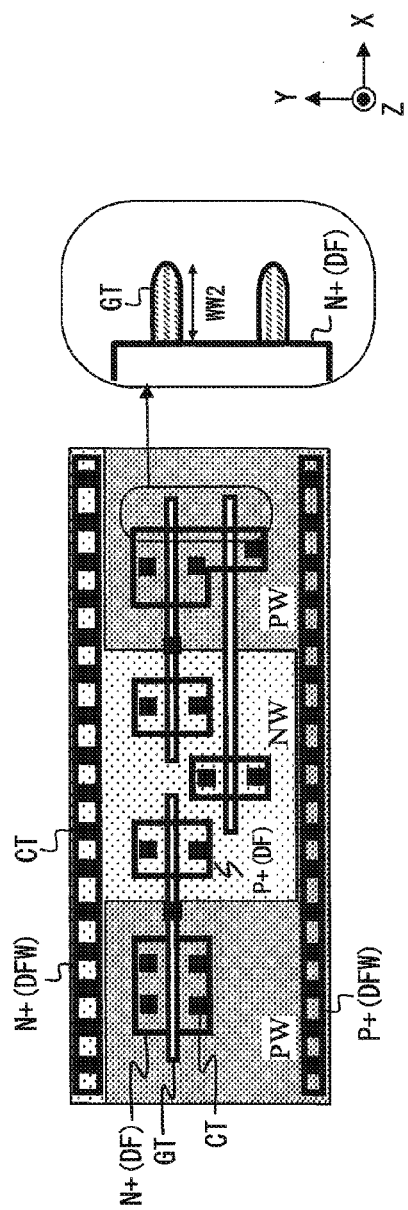

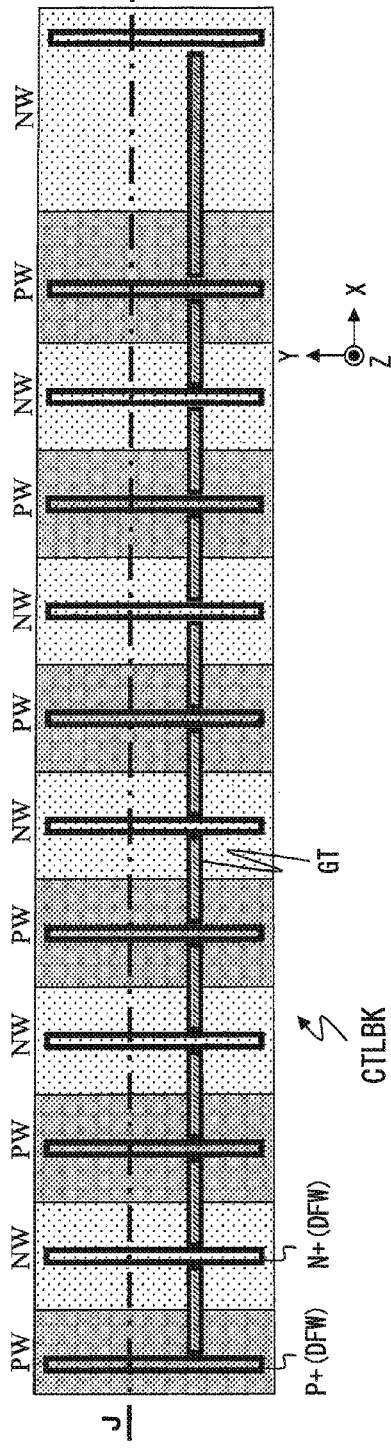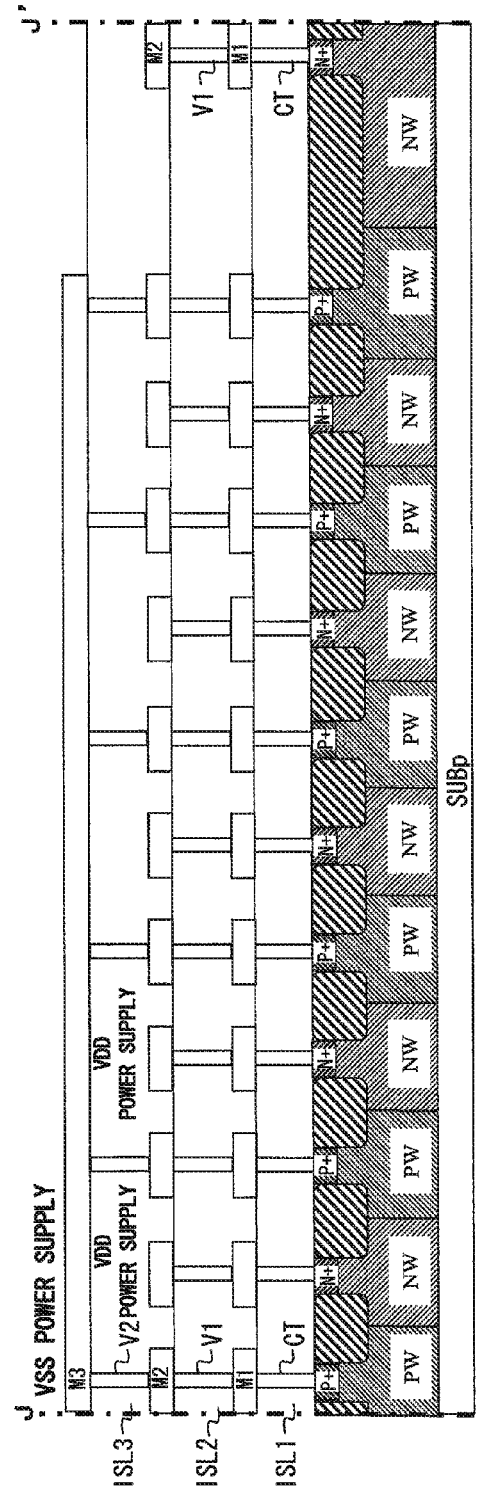
FIG. 29A
FIG. 29B

SEMICONDUCTOR DEVICE AND METHOD OF MANUFACTURING SEMICONDUCTOR DEVICE

CROSS REFERENCE TO RELATED APPLICATION

This application is a divisional application of U.S. application Ser. No. 14/234,479, filed Jan. 23, 2014, the entirety of the contents and subject matter of all of the above is incorporated herein by reference.

TECHNICAL FIELD

The present invention relates to a semiconductor device and a method of manufacturing the semiconductor device, and, more particularly, the present invention relates to a technique effectively applied to a semiconductor device provided with a memory unit such as SRAM and relates to a method of manufacturing the same.

BACKGROUND ART

For example, Patent Documents 1 and 2 describe arrangement of a well of a memory array of a dynamic-type RAM. Specifically, in a p-type substrate or a deep well, a p-type well is formed to be adjacent to both sides of an n-type well, an n-channel-type MOSFET such as a selective transistor of a memory cell or a sense amplifier is formed in the p-type well, and a p-channel-type MOSFET such as a sense amplifier is formed in the n-type well. Also, Patent Document 2 describes arrangement of wells of a peripheral circuit and an input/output circuit of a memory array of the dynamic-type RAM. Specifically, an n-type well and a p-type well each having an elongate shape whose longitudinal direction is a direction in which a word line extends are alternately arranged along a direction in which the word line is arranged.

PRIOR ART DOCUMENTS

Patent Documents

Patent Document 1: Japanese Patent Application Laid-Open Publication No. H11-54726
Patent Document 2: Japanese Patent Application Laid-Open Publication No. H08-181292

DISCLOSURE OF THE INVENTION

Problems to be Solved by the Invention

In recent years, miniaturization of a semiconductor device has been increasingly advanced. Under such circumstances, for example, in a semiconductor device equipped with a memory unit or others, such a layout that the p-type wells and the n-type wells are alternately arranged is used. While an n-channel-type MOSFET is formed in the p-type well and a p-channel-type MOSFET is formed in the n-type well, it is required to ensure a power feeding region for feeding power to the wells in each of the wells in addition to such MOSFETs. In this case, it has been found out by studies of the present inventors that only simple ensuring of the power feeding region causes a risk of reduction in the degree of freedom of the layout, which results in interruption of downsizing (miniaturization) of an area of the semiconductor device.

Particularly, in a case of usage of a manufacturing process for the minimum processing size of, for example, 28 nm or others, it is desired to extend all gate layers in the same direction as each other on a semiconductor device (semiconductor chip) in order to sufficiently ensure a processing accuracy. However, if all gate layers are extended in the same direction, the degree of freedom of the layout is lower than that in the case without limitation of the extending directions of the gate layers, and, as a result, the downsizing (miniaturization) of the area of the semiconductor device cannot be achieved in some cases. Such a case requires a method for further efficient layout in addition to the above-described power feeding region.

The present invention has been made in consideration of such circumstances, and a preferred aim of the present invention is to provide a semiconductor device having a high degree of freedom of the layout and a method of manufacturing the semiconductor device. The above and other preferred aims and novel characteristics of the present invention will be apparent from the description of the present specification and the accompanying drawings.

Means for Solving the Problems

A summary of a typical embodiment of inventions disclosed in the present application will be briefly described as follows.

A semiconductor device according to the present embodiment has: a first well region (NW) of a first conductivity type including a first part (ARN1a), a second part (ARN1b), and a third part (ARN2); a first power feeding region (N+ (DFW)) of the first conductivity type having a higher impurity concentration than that of the first well region; and a second well region (PW) of a second conductivity type including a fourth part (ARP1b). The first part (ARN1a) and the second part (ARN1b) are arranged to be adjacent to both sides of the fourth part (ARP1b) in a first direction. The third part (ARN2) has a shape extending in the first direction, and is arranged to be joined to the first part (ARN1a) and the second part (ARN1b) and be adjacent to the fourth part (ARP1b) in a second direction intersecting with the first direction. The first power feeding region (N+(DFW)) is formed inside the third part (ARN2) to have a substantially rectangular shape, and supplies a predetermined voltage to the first part (ARN1a) and the second part (ARN1b) via the first well region (NW). Here, a size of the first power feeding region (N+(DFW)) in the first direction is formed to be larger than a size thereof in the second direction.

Also, a method of manufacturing the semiconductor device according to the present embodiment has steps of (a) to (f). In the step of (a), a second well region (PW) of a second conductivity type including a fourth part (ARP1b) is formed on a semiconductor substrate (SUBp). In the step of (b), on the semiconductor substrate (SUBp), a first well region (NW) of a first conductivity type is formed, the first well region including: a first part (ARN1a) and a second part (ARN1b) arranged to be adjacent to both sides of the fourth part (ARP1b) in a first direction; and a third part (ARN2) joined to the first and second parts in a second direction intersecting with the first direction and arranged to be adjacent to the fourth part. In the step of (c), a first insulating film (STI) is formed on the first and second well regions in parts except for a first source/drain pattern (PW (exposed part) for N+(DF)) serving as a partial region of the fourth part, a second source/drain pattern (NW (exposed part) for P+(DF)) serving as a partial region of the first part or the second part, and a power feeding pattern (NW (exposed part) for N+(DFW)) serving as a partial region of the third part. Note that the power feeding pattern is a region having a substantially rectangular shape and having a larger size in the first direction than the second direction. In the step of (d), a gate layer (GT) having a linear shape is formed so as to extend over the first source/drain pattern and over the second source/drain pattern in the first direction. In the step of (e), the gate layer is partially etched through mask processing (GTRE). In the step of (f), an impurity of the first conductivity type is introduced to the first source/drain pattern, an impurity of the second conductivity type is introduced to the second source/drain pattern, and an impurity of the first conductivity type is introduced to the power feeding pattern.

Effects of the Invention

As brief description of the effects obtained by the typical embodiment of the inventions disclosed in the present application, the degree of freedom of the layout can be improved.

BRIEF DESCRIPTIONS OF THE DRAWINGS

FIG. 7 is a plan view illustrating an outline layout configuration example of a part of a memory array of the memory unit of FIG. 3;

FIGS. 19A and 19B are a cross-sectional view illustrating an outline device structure example of a part between E-E' in FIG. 18 and a cross-sectional view illustrating an outline device structure example of a part between F-F' in FIG. 18, respectively;

FIGS. 21A and 21B are a plan view illustrating a configuration example of well arrangement and well power feeding method in a semiconductor device according to the third embodiment of the present invention and a plan view illustrating a comparison example with FIG. 21A, respectively;

Figure 3:
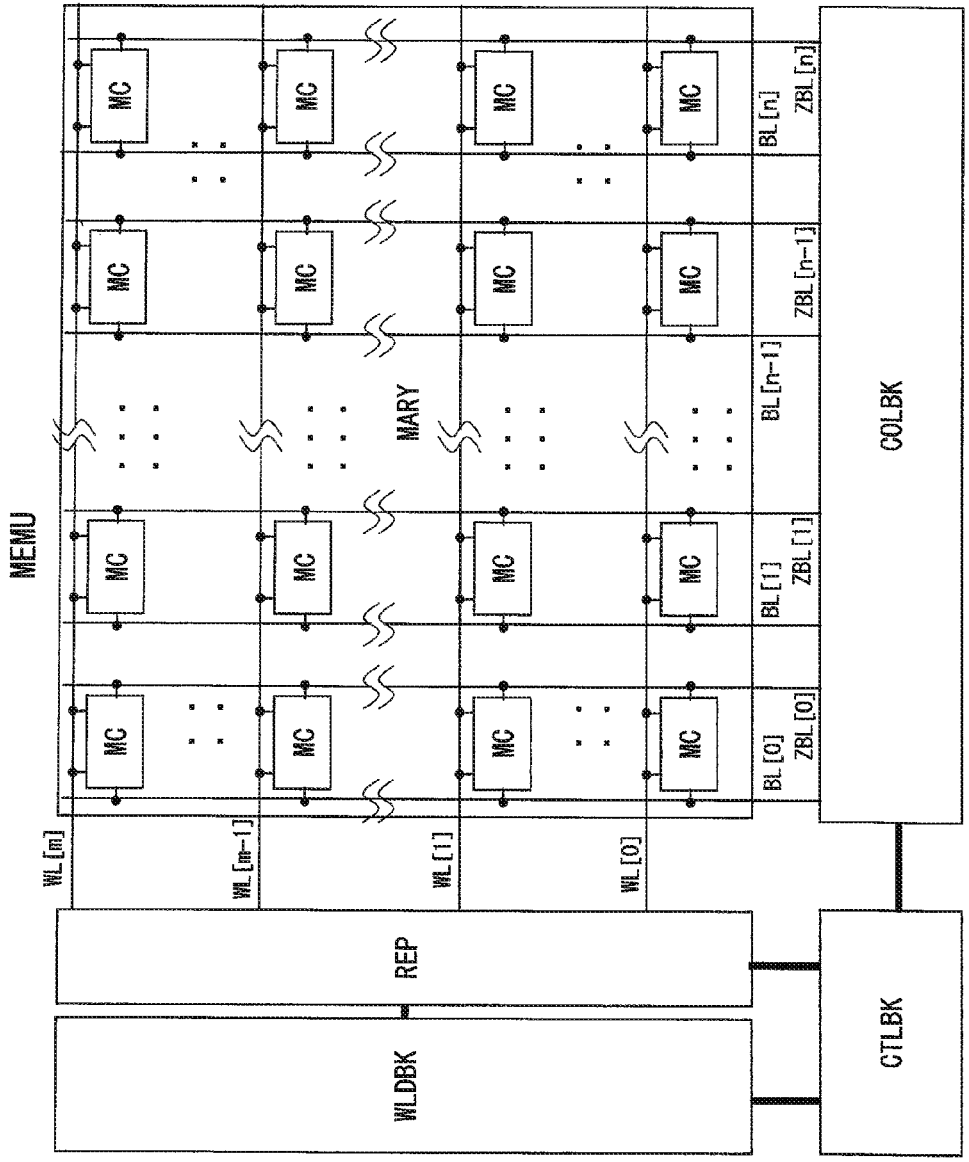
FIG. 3 is a block diagram illustrating an outline configuration example of a principal part of a memory unit included in the semiconductor device of FIG. 1.
Figure 28A:
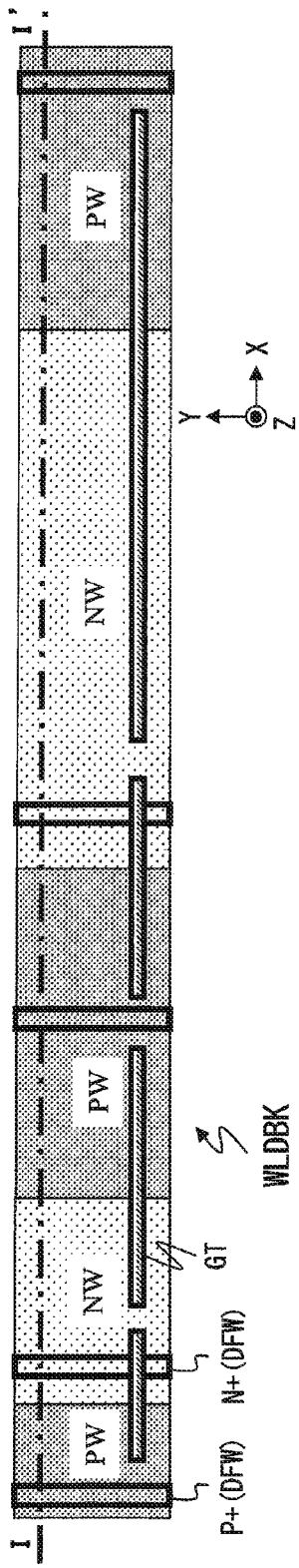
Figure 28B:
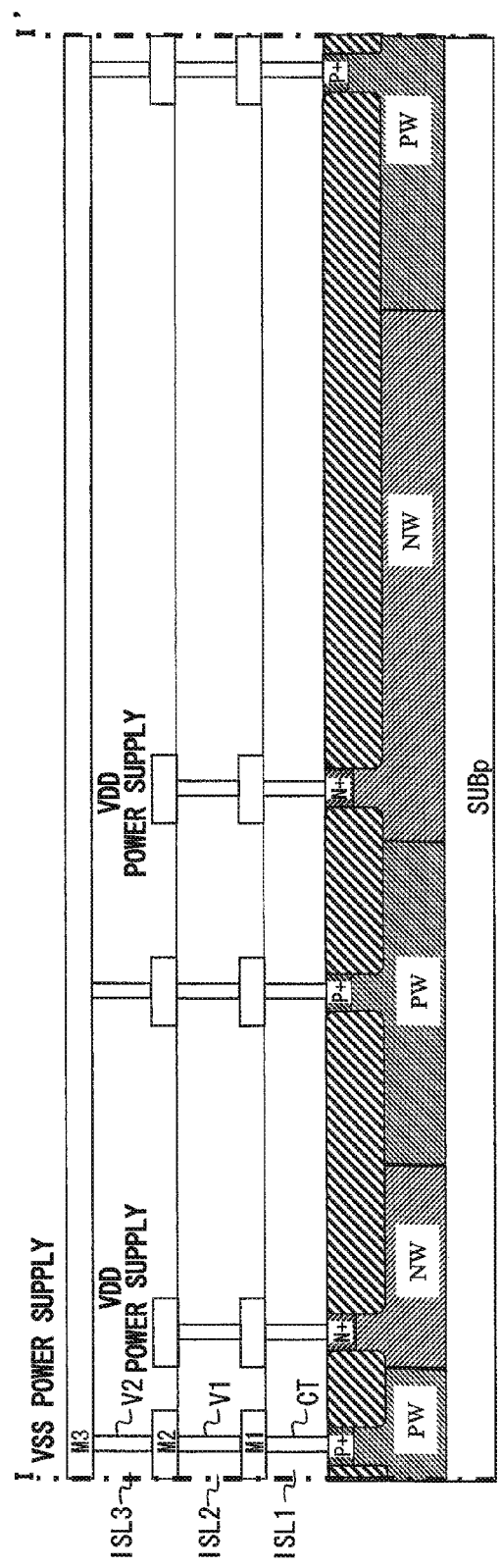

FIGS. 28A and 28B are a plan view illustrating an outline layout configuration example regarding well arrangement and well power feeding of a word-line drive circuit block of FIG. 3 in the semiconductor device according to the fourth embodiment of the present invention, and a cross-sectional view illustrating an outline device structure example of a part between I-I' in FIG. 28A; and FIGS. 29A and 29B are a plan view illustrating an outline layout configuration example regarding well arrangement and well power feeding of the entire control circuit block of FIG. 3 in the semiconductor device according to the fourth embodiment of the present invention, and a cross-sectional view illustrating an outline device structure example of a part between J-J' in FIG. 29A.

BEST MODE FOR CARRYING OUT THE INVENTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Note that, in the following embodiments, a MIS (Metal Insulator Semiconductor) type field effect transistor (FET) is referred to as a MIS transistor, a p-channel type MIS transistor is referred to as "PMIS transistor", and an n-channel type MIS transistor is referred to as "NMIS transistor". Hereinafter, embodiments of the present invention will be described in detail with reference to the accompanying drawings. Note that the same components are denoted by the same reference symbols throughout the drawings for describing the embodiments, and the repetitive description thereof will be omitted.

First Embodiment

<<Outline Configuration of Entire Semiconductor Device>>

Figure 1:
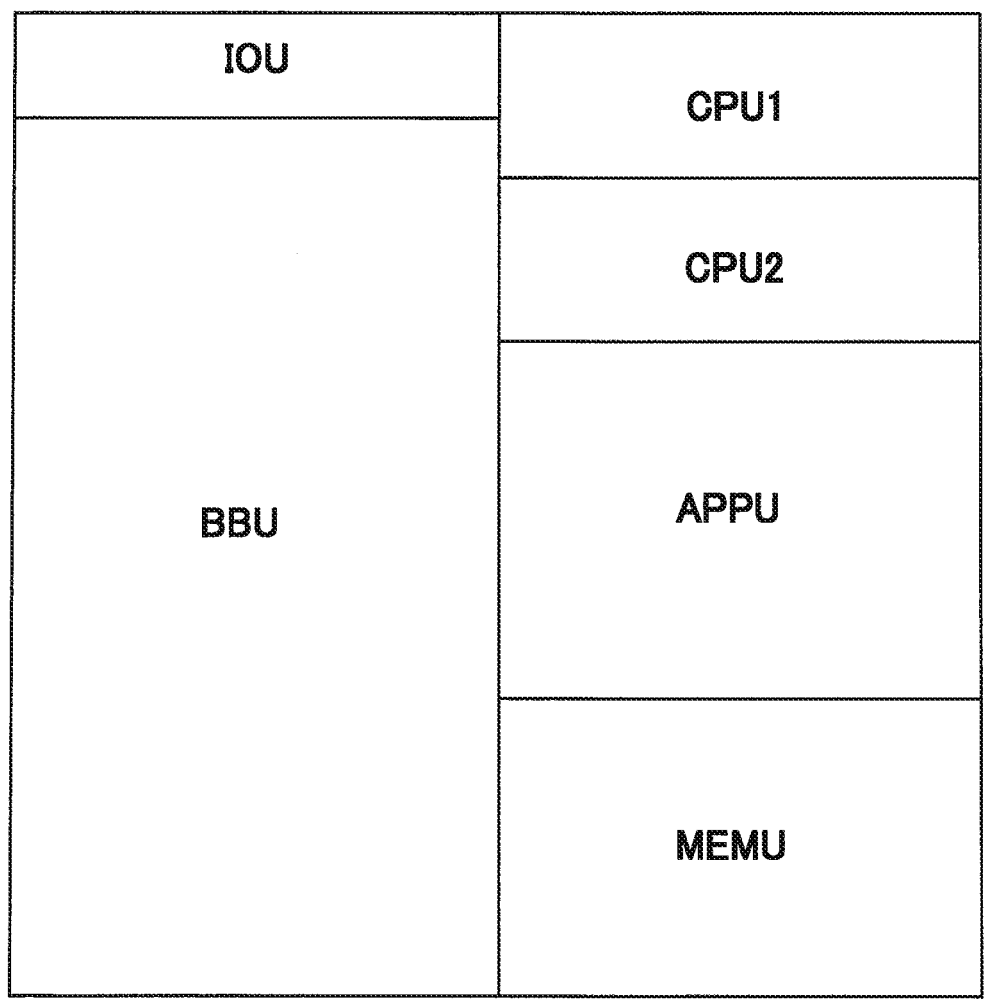
FIG. 1 is a block diagram illustrating an outline configuration example of the entire semiconductor device according to a first embodiment of the present invention.
Figure 2:
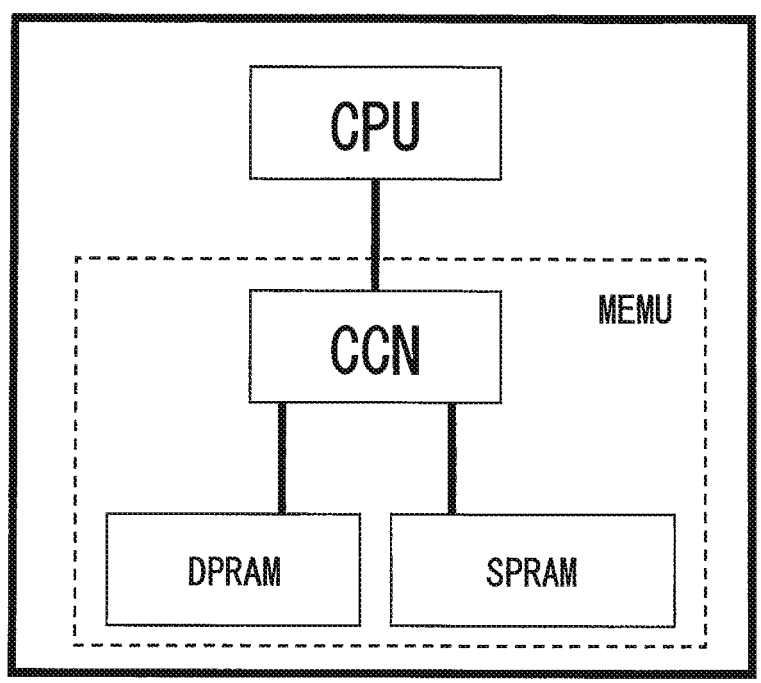
FIG. 2 is an explanatory diagram illustrating a usage example of a memory unit of FIG. 1.

FIG. 1 is a block diagram illustrating an outline configuration example of the entire a semiconductor device according to the first embodiment of the present invention. FIG. 2 is an explanatory diagram illustrating a usage example of a memory unit of FIG. 1. FIG. 1 illustrates a semiconductor device (LSI) referred to as SOC (System On a Chip) having various types of a logic circuit and a memory circuit formed in one semiconductor chip or others. The semiconductor device of FIG. 1 is, for example, an LSI for a mobile phone, and is provided with two processor units CPU1 and CPU2, an application unit APPU, a memory unit MEMU, a baseband unit BBU, and an input/output unit IOU.

The CPU1 and CPU 2 perform a predetermined computing process based on a program, the APPU performs a predetermined application process required by a mobile phone, the BBU performs a predetermined baseband process in accordance with wireless communication, and the IOU serves as an input/output interface with outside. The MEMU includes, for example, a SRAM (Static Random Access Memory) or others, and is appropriately accessed in accordance with such a process of each circuit block. For example, as illustrated in FIG. 2, the MEMU is provided with a dual-port type SRAM (DPRAM) and a single-port type SRAM (SPRAM), and is used as a cache memory of a processor unit CPU. At this time, for example, a cache controller CCN included in the MEMU or others appropriately accesses the DPRAM and the SPRAM, so that cache hit and cache mishit are judged, and a reading process and an updating process of cache data are performed.

In such a semiconductor device, the DPRAM and the SPRAM are often mounted by using, for example, an automatic designing tool called a memory compiler or others, and a SRAM generated by the tool is referred to as a compiled SRAM or others. The memory compiler automatically generates the compiled SRAM by sequentially repeatedly arranging a certain unit layout or others in accordance with, for example, the specified numbers of bit lines and word lines. In this case, also for such repeated arrangement, a layout method having a high degree of freedom and high area efficiency is required.

<<Outline Configuration of Principal Part of Memory Unit>>

FIG. 3 is a block diagram illustrating an outline configuration example of a principal part of a memory unit included in the semiconductor device of FIG. 1. The memory unit MEMU illustrated in FIG. 3 is provided with a total control circuit block CTLBK, a word-line drive circuit block WLDBK, a replica circuit REP, a memory array MARY, and a column control circuit block COLBK. The MARY is provided with (m+1) word lines WL[0] to WL[m] extending in a first direction, (n+1) bit-line pairs (BL[0], ZBL[0]) to (BL[n], ZBL[n]) extending in a second direction intersecting with the first direction, and a plurality of memory cells MC arranged at intersection points of the (m+1) word lines and (n+1) bit-line pairs. Each of the bit-line pairs is configured of two bit lines (for example, BL[0] and ZBL[0]) which transmit a complementary signal.

The total control circuit block CTLBK appropriately controls the word-line drive circuit block WLDBK, the replica circuit REP, and the column control circuit block COLBK in accordance with, for example, a reading/writing control signal, an address signal, etc. which are inputted from outside. The WLDBK receives a row selecting signal generated by the CTLBK based on the address signal, and activates any one of the (m+1) word lines WL[0] to WL[m] in accordance with this. The COLBK is provided with a sense amplifier circuit, an input/output buffer circuit, etc., receives a column selecting signal generated by the CTLBK based on the address signal, and selects a predetermined bit-line pair among the (n+1) bit-line pairs in accordance with this. In the COLBK, the data of the selected bit-line pair is amplified by the sense amplifier circuit in a reading operation, and then, is outputted to outside via an output buffer circuit, and the data inputted from outside via the input buffer circuit is transmitted to the selected bit-line pair in a writing operation.

The replica circuit REP is provided with a timing adjusting circuit therein, and determines the activation timing of the sense amplifier circuit in the COLBK by receiving an activation signal generated by the CTLBK based on the reading control signal and adding a predetermined delay to the activation signal. Moreover, the REP, for example, determines the deactivation timing of the word line which has been activated in the WLDBK by receiving an activation signal generated by the CTLBK based on the writing control signal and adding a predetermined delay to the activation signal.

<<Details of Memory Array>>

Figure 4:
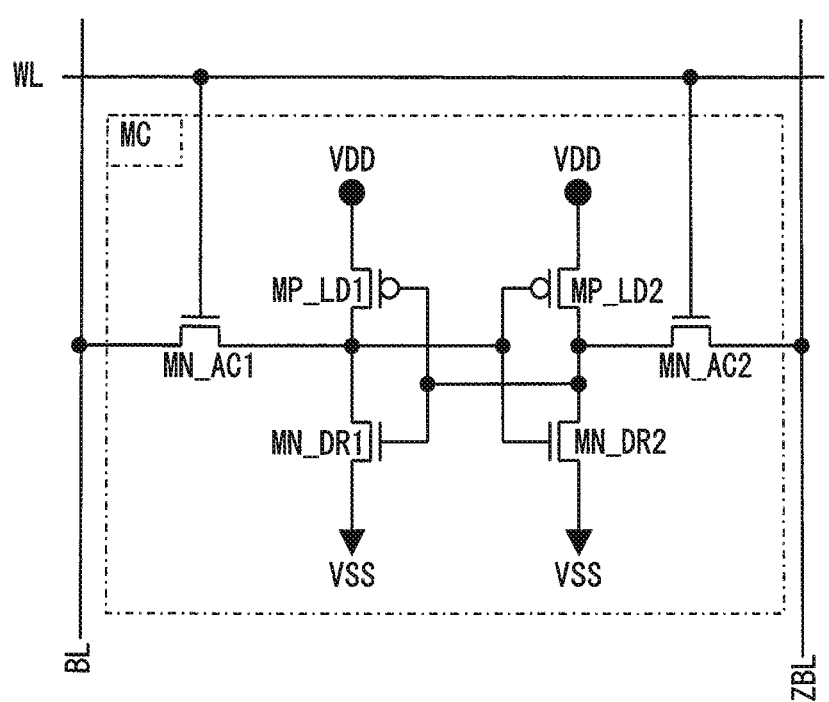
FIG. 4 is a circuit diagram illustrating a configuration example of each of memory cells in the memory unit of FIG. 3.

FIG. 4 is a circuit diagram illustrating a configuration example of each of the memory cells in the memory unit of FIG. 3. A memory cell MC illustrated in FIG. 4 is here a SRAM memory cell provided with four NMIS transistors MN_AC1, MN_AC2, MN_DR1, and MN_DR2 and two PMIS transistors MP_LD1 and MP_LD2. The MN_DR1 and the MN_DR2 are driver transistors, the MN_AC1 and the MN_AC2 are access transistors, and the MP_LD1 and the MP_LD2 are loading transistors. A gate of the MN_AC1 is connected to the word line WL, and either one of a source and a drain thereof is connected to the bit line BL on the positive side. A gate of the MN_AC2 is connected to the WL, and either one of a source and a drain thereof is connected to the bit line ZBL on the negative side.

Each of "the MN_DR1 and the MP_LD1" and "the MN_DR2 and the MP_LD2" configures a complementary-type MIS inverter circuit (referred to as a CMIS inverter circuit) between a power-supply voltage VDD and a ground power-supply voltage VSS. In these two CMIS inverter circuits, an input of either one of them is connected to an output of the other so as to configure a latch circuit. The other one of the source and drain of the MN_AC2 is connected to the input of the CMIS inverter circuit (MN_DR1, MP_LD1) (the output of the CMIS inverter circuit (MN_DR2, MP_LD2)). The other one of the source and the drain of the MN_AC1 is connected to the input of the CMIS inverter circuit (MN_DR2, MP_LD2) (the output of the CMIS inverter circuit (MN_DR1, MP_LD1)).

Figure 5:
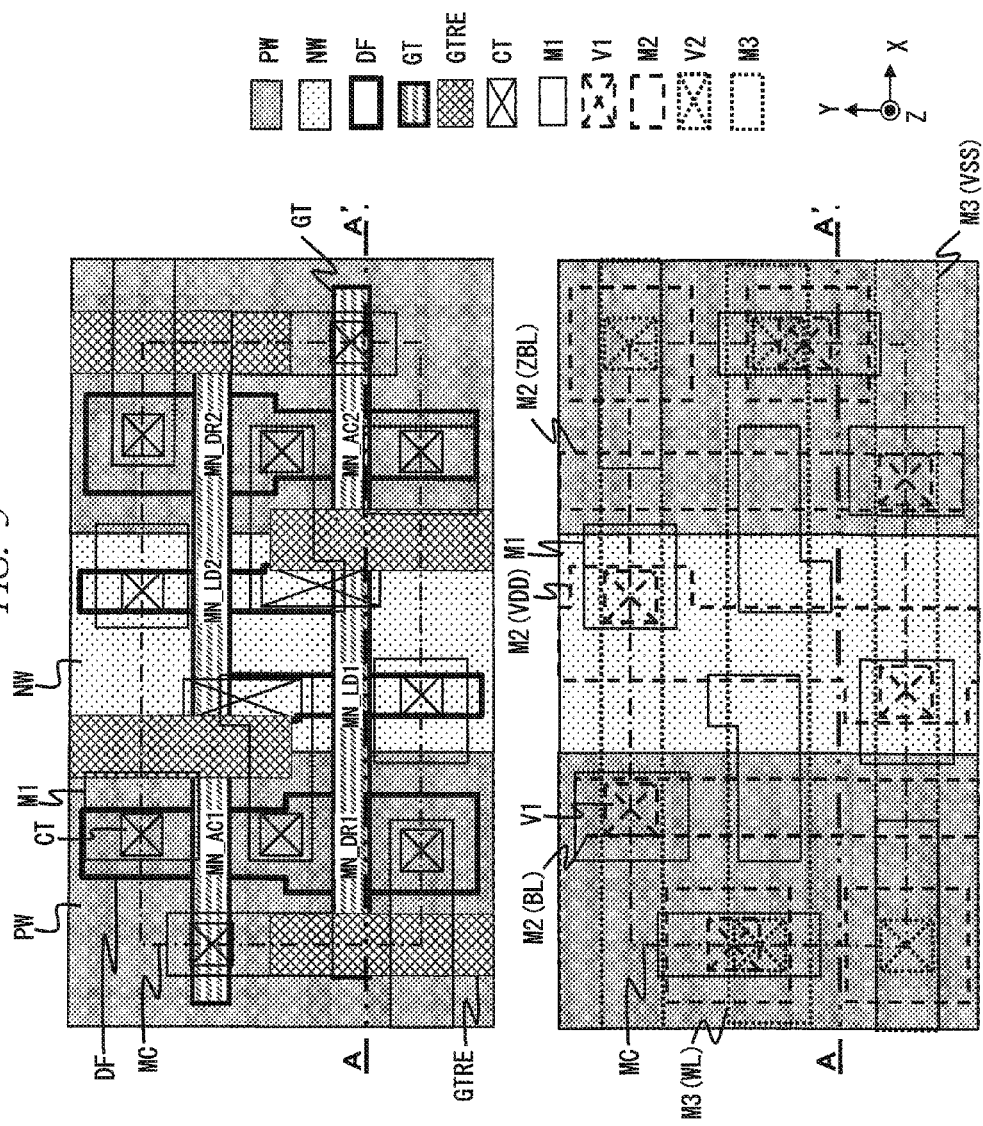
FIG. 5 is a plan view illustrating a layout configuration example of the memory cell of FIG. 4.

FIG. 5 is a plan view illustrating a layout configuration example of the memory cell of FIG. 4. FIG. 5 separately illustrates a layout from a well to a first metal wiring layer sequentially formed in a Z-axis direction intersecting with an X-axis direction which is the extending direction (longitudinal direction) of the word line and with a Y-axis direction which is the extending direction (longitudinal direction) of the bit line, and a layout from the first metal wiring layer to a third metal wiring layer formed in the direction. In the memory cell MC illustrated in FIG. 5, first, an n-type well NW is arranged, and p-type wells PW are arranged to be adjacent to both sides of the NW in the X-axis direction. Above the two wells PW and NW (in the Z-axis direction), each of two linear gate layers GT which are along each other so as to extend in the X-axis direction is arranged via a gate insulating film (not illustrated).

However, the two linear gate layers GT are divided into two GTs by a gate twice-patterning process using a gate twice-patterned mask pattern GTRE. As a result, The GT is formed as GT (referred to as GTa) extending above the NW and one PW, GT (referred to as GTb) extending above the other PW on an extended line of the GTa, GT (referred to as GTc) extending above the NW and the other PW, and GT (referred to as GTd) extending above one PW on an extended line of the GTc. Note that the gate twice-patterning process is a technique of separation into two linear patterns by, for example, upon formation of the two linear patterns linearly extending through a discontinuity, forming one linear pattern once by mask processing, and then, cutting a part of the linear pattern by using the GTRE. This manner can increase a processing accuracy of the linear patterns higher than that in a case of separately forming the two linear patterns by performing the mask processing once, and therefore, is beneficial to miniaturization.

The above-described driver NMIS transistor MN_DR1 is formed in the part of the GTa above one PW, and the above-described load PMIS transistor MP_LD1 is formed in the part of the GTa above the NW. Moreover, the above-described access NMIS transistor MN_AC2 is formed in the part of the GTb. Similarly, the driver NMIS transistor MN_DR2 is formed in the part of the GTc above the other PW, and the load PMIS transistor MP_LD2 is formed in the part of the GTc above the NW. Moreover, the access NMIS transistor MN_AC1 is formed in the part of the GTd.

In one PW, $n^+$-type semiconductor regions (diffusion layers) DF are formed on both sides (in the Y-axis direction) of the respective gate layers GT configuring the MN_DR1 and the MN_AC1. Among them, the DF positioned between the GT of the MN_DR1 and the GT of the MN_AC1 is shared by the MN_DR1 and the MN_AC1, and is connected to the first metal wiring layer M1 via a contact layer CT arranged above the DF. Similarly, in the PW on the other side, $n^+$-type semiconductor regions (diffusion layers) DF are formed on both sides of the respective GTs configuring the MN_DR2 and the MN_AC2. Among them, the DF positioned between the GT of the MN_DR2 and the GT of the MN_AC2 is shared by the MN_DR2 and the MN_AC2, and is connected to the M1 via the CT arranged above the DF.

In the NW, $p^+$-type semiconductor regions (diffusion layers) DF are formed on both sides (in the Y-axis direction) of each of the gate layer GT configuring the MN_LD1 and the GT configuring the MN_LD2. The one side of the DF in the MN_LD1 is connected to the above-described DF shared between the MN_DR1 and the MN_AC1 and to a common GT between the MN_LD2 and the MN_DR2 appropriately via the contact layer CT and/or the first metal wiring layer M1. Similarly, the one side of the DF in the MN_LD2 is connected to the above-described DF shared between the MN_DR2 and the MN_AC2 and to a common GT between the MN_LD1 and the MN_DR1 appropriately via the CT and/or the M1. Note that an n-type diffusion layer (or well) is formed by, for example, introducing an impurity such as phosphorous (P) or arsenic (As) into silicon (Si), and a p-type diffusion layer (or well) is formed by, for example, introducing an impurity such as boron (B) into silicon (Si). Also, the $n^+$-type is higher than n-type in the impurity concentration, and the $p^+$-type is higher than p-type in the impurity concentration.

Each of the other semiconductor regions (diffusion layers) DF in the MN_LD1 and the MN_LD2 is connected to the first metal wiring layer M1 via the contact layers CT arranged above the DF. The two layers M1 are commonly connected to the second metal wiring layer M2 which is arranged above the V1 and which extends in the Y-axis direction, via the first via layer V1 arranged above each of the M1. The layers M2 are wiring for the power-supply voltage VDD. The DF on the side not shared by the MN_DR1 in the MN_AC1 is connected to the M1 via the CT arranged above the DF, and besides, is connected to the M2 extending in the Y-axis direction, via the V1 arranged above the M1. This M2 serves as wiring for the bit line BL. Similarly, the DF on the side not shared by the MN_DR2 in the MN_AC2 is connected to the M1 via the CT arranged above the DF, and besides, is connected to the M2 extending in the Y-axis direction, via the V1 arranged above the M1. This M2 serves as wiring for the bit line ZBL.

Furthermore, above the memory cell MC, three third metal wiring layers M3 which are along each other so as to extend in the X-axis direction are arranged. Among them, the M3 in the middle serves as wiring for the word line WL, and the M3 on both sides thereof serve as wiring for the ground power-supply voltage VSS. Above each of the two p-type wells PW, the M3 for the WL is connected to the second metal wiring layer M2 via the second via layer V2 arranged below the M3, and besides, is connected to the first metal wiring layer M1 via the first via layer V1 arranged below the M2. One of these two M1 is connected to the gate layer GT of the MN_AC1 via the contact layer CT arranged below the M1, and the other of the two M1 is similarly connected to the GT of the MN_AC2 via the CT.

Also, above the PW on one side, one of the remaining two M3 except for the third metal wiring layer M3 for the word line WL is connected to the M2 via the V2 arranged below the M3, and besides, is connected to the M1 via the V1 arranged below the M2. This M1 is connected to the DF on the side not shared by the MN_AC1 in the MN_DR1 via the CT arranged below the M1. Similarly, above the PW on the other side, the other of the remaining two M3 is connected to the M2 via the V2 arranged below the M3, and besides, is connected to the M1 via the V1 arranged below the M2. This M1 is connected to the DF on the side not shared by the MN_AC2 in the MN_DR2 via the CT arranged below the M1.

Figure 6:
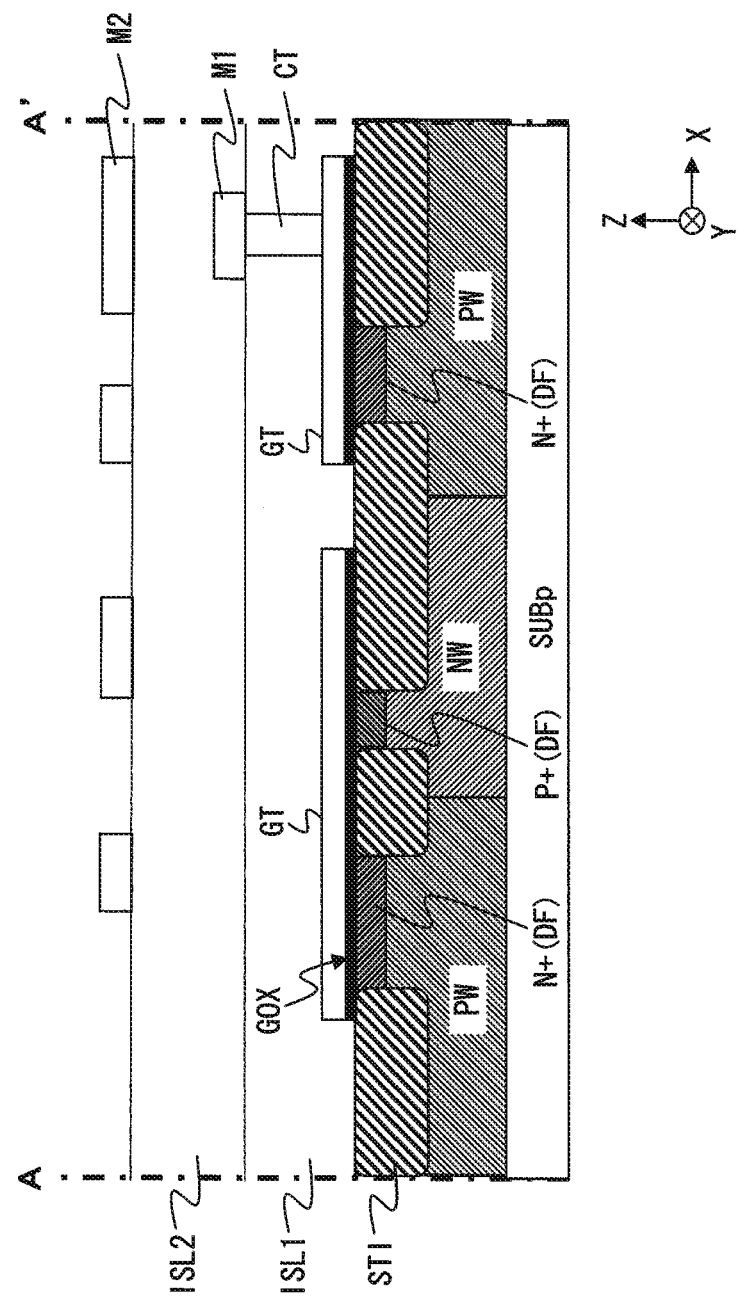
FIG. 6 is a cross-sectional view illustrating an outline device structure example of a part between A-A' of the memory cell of FIG. 5.

FIG. 6 is a cross-sectional view illustrating an outline device structure example of a part between A-A' of the memory cell of FIG. 5. In FIG. 6, the n-type well NW and the two p-type wells PW are arranged on a p-type semiconductor substrate SUBp. The two wells PW are arranged to be adjacent to both sides of the NW in the X-axis direction. In a principal surface of the semiconductor substrate, a $n^+$-type semiconductor region (diffusion layer) N+(DF) is formed in each of the two wells PW, and a $p^+$-type semiconductor region (diffusion layer) P+(DF) is formed in the NW. Moreover, in the principal surface of the semiconductor substrate, a buried insulating film (isolation film) STI is formed in each of the PW and the NW. The film STI is formed so as to surround each of the N+(DF) and the P+(DF) on an X-Y plane.

On the principal surface of the semiconductor substrate, the gate layer GT is formed via a gate insulating film GOX. The GOX is desirably formed of, for example, a high dielectric film represented by a hafnium-based material or others having a higher dielectric constant than that of silicon dioxide, and the GT is formed of, for example, a metal film or others. However, as a matter of course, as widely known, the GOX formed of silicon dioxide ($SiO_2$) or others and the GT formed of a stacked film obtained by appropriately combining polysilicon, a metal film (made of titanium nitride (TIN) or others), a silicide film, etc. can be also used. An interlayer insulating film ISL1 is formed on the GT and the principal surface of the semiconductor substrate, and partially has the contact layer CT formed so that one end thereof is connected to the GT. The ISL1 is formed of, for example, a TEOS (Tetra Ethyl Ortho Silicate) film, silicon dioxide, and others, and the CT is formed of, for example, a stacked film obtained by combining, for example, titanium (TI), titanium nitride, tungsten (W), etc. On the ISL1, the first metal wiring layer M1 is formed so as to be connected to the other end of the CT. The M1 is mainly made of, for example, copper (Cu). An interlayer insulating film ISL2 is formed on the M1 and the ISL1, and besides, the second metal wiring layer M2 is formed above the ISL2.

FIG. 7 is a plan view illustrating an outline layout configuration example of a part of the memory array of the memory unit of FIG. 3. FIG. 7 illustrates a layout configuration example of the memory cell MC for 4×4 bits in the memory array. Practically, in accordance with the number of bits in the X-axis direction (that is, the number of the bit-line pairs) and the number of bits in the Y-axis direction (that is, the number of the word lines), the layout for the 4×4 bits is sequentially continuously arranged in the X-axis direction and the Y-axis direction. As illustrated in FIG. 7, the layout of the MCs which are adjacent to each other is line symmetry. For example, the layout of the two memory cells MC which are adjacent to each other in the X-axis direction are linearly symmetric with respect to each other based on the Y-axis, and the layout of the two memory cells MC which are adjacent to each other in the Y-axis direction are linearly symmetric with respect to each other based on the X-axis. Note that FIG. 7 representatively illustrates the p-type well PW, the n-type well NW, the gate layer GT, and the gate twice-patterning mask pattern GTRE as the layout of each MC. However, more specifically, the above-described layouts of FIG. 5 are applied.

<<Details of Column Control Circuit Block>>

Figure 8:
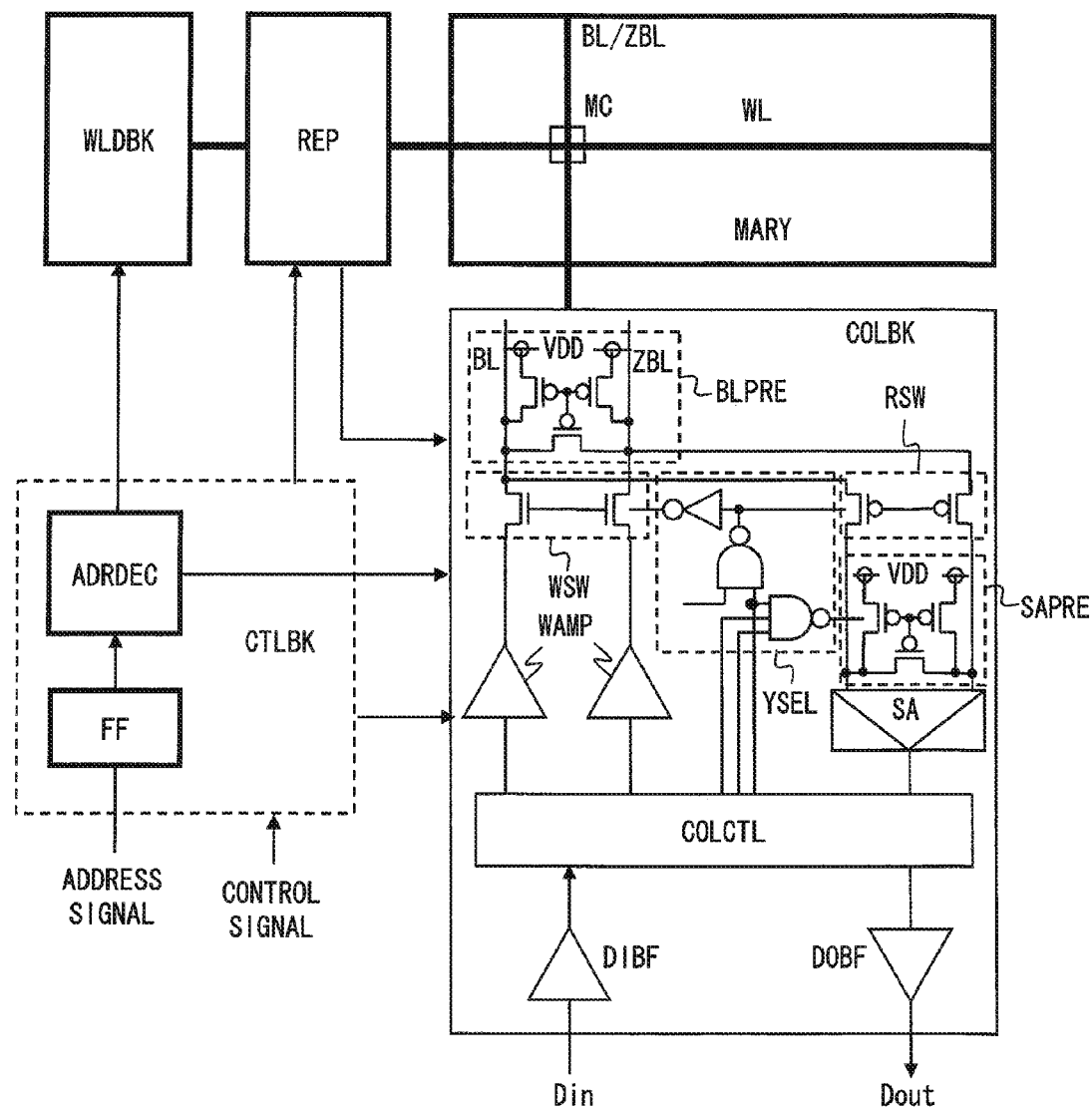
FIG. 8 is a circuit diagram illustrating an outline configuration example of a column control circuit block of the memory unit of FIG. 3.
Figure 9:
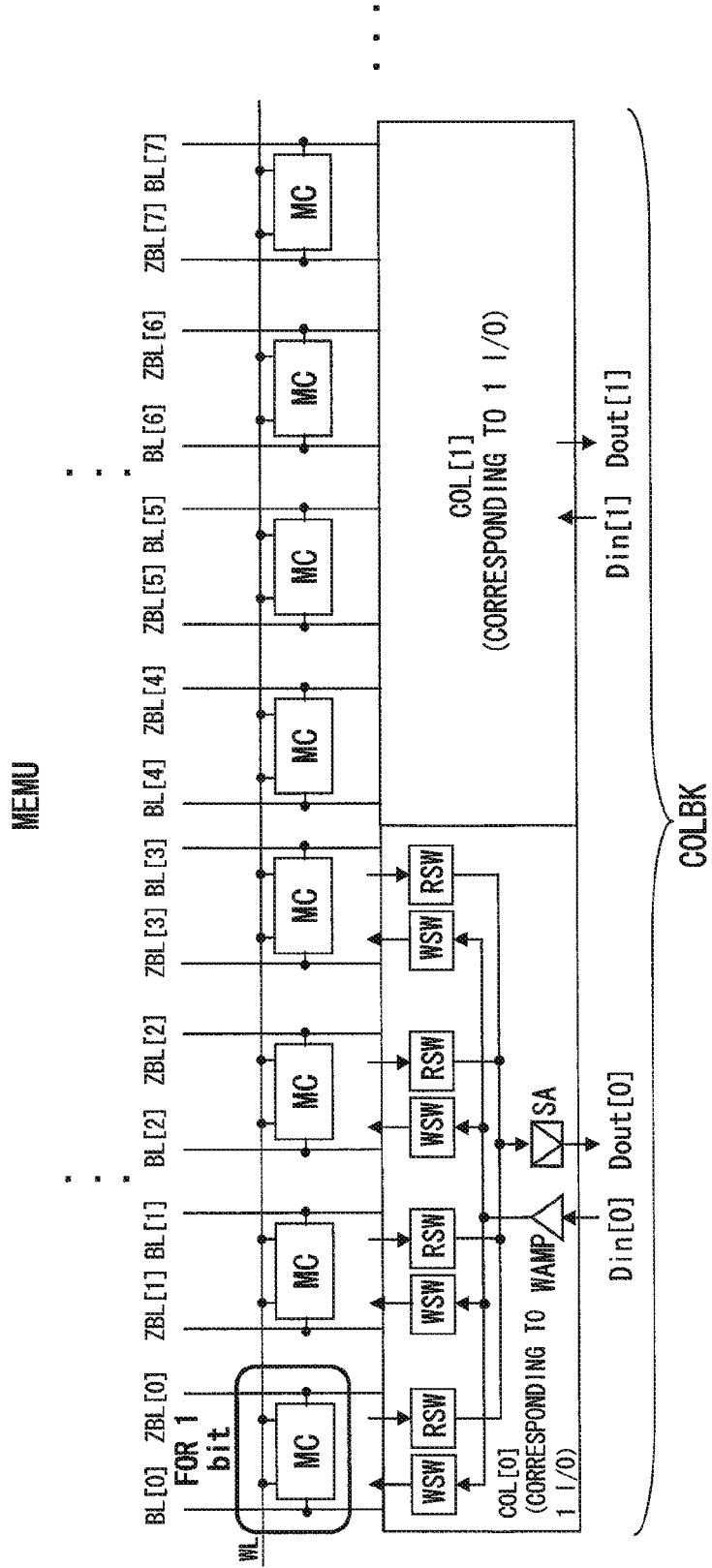
FIG. 9 is a schematic diagram illustrating a practical configuration example using the column control circuit block of FIG. 8.

FIG. 8 is a circuit diagram illustrating an outline configuration example of the column control circuit block of the memory unit of FIG. 3. FIG. 9 is a schematic diagram illustrating a practical configuration example using the column control circuit block of FIG. 8. The column control circuit block COLBK illustrated in FIG. 8 is provided with a column control circuit COLCTL, a column selecting circuit YSEL, and a bit-line precharge circuit BLPRE. Furthermore, the COLBK is provided with an input buffer circuit DIBF, a writing amplifier circuit WAMP, and a writing switch circuit WSW as writing circuits, and is provided with an output buffer circuit DOBF, a reading switch circuit RSW, a sense-amplifier precharge circuit SAPRE, and a sense amplifier circuit SA as reading circuits.

The column control circuit COLCTL controls the entire COLBK based on control signals transmitted from the total control circuit block CTLBK and the replica circuit REP. For example, a column selecting signal (column selecting signal), an identification signal for the reading operation and the writing operation, etc. are contained in the control signals transmitted from CTLBK, and an activation signal of the sense amplifier circuit, etc. are contained in the controls signals transmitted from the REP. Note that the column selecting signal is generated by latching the address signal which has been inputted from outside to the CTLBK, by a latch circuit FF, and decoding the latched signal by an address decode circuit ADRDEC. The identification signal for the reading operation and the writing operation is generated by interpreting the control signal, which has been inputted from outside, by the CTLBK.

The bit-line precharge circuit BLPRE is here configured of three PMIS transistors, and previously precharges the bit-line pair (BL, ZBL) at the power-supply voltage VDD based on the control of the column selecting circuit YSEL in a stage prior to the reading operation or the writing operation. The DIBF is configured of, for example, combination of a plurality of PMIS transistors and NMIS transistors, and, in the writing operation, takes the data input signal "Din" in from outside, and outputs the signal to the write amplifier circuit WAMP. The WAMP is configured of, for example, combination of a plurality of PMIS transistors and NMIS transistors, amplifies the signal inputted from the DIBF and outputs the signal as a complementary data signal. The writing switch circuit WSW is here configured of two NMIS transistors, and transmits the complementary data signal, which has been inputted from the WAMP, to the predetermined bit-line pair (BL, ZBL) based on control of the column selecting circuit YSEL. In FIG. 8, one WSW is simply connected to one WAMP. However, practically, as illustrated in FIG. 9, a plurality of (for example, four) WSW are connected in parallel to one WAMP, and one WSW among them is selected via the YSEL.

In the example of FIG. 9, in a column circuit COL[0] corresponding to one I/O in the column control circuit block COLBK, the output of one WAMP corresponding to the data input signal Din[0] is connected to each of the four bit-line pairs (BL[0], ZBL[0]) to (BL[3], ZBL[3]) via four WSW. Also, similarly in a column circuit COL[1] corresponding to another one I/O in the COLBK, the output of one WAMP corresponding to the data input signal Din[1] is connected to each of the four bit-line pairs (BL[4], ZBL[4]) to (BL[7], ZBL[7]) via four WSW although illustration is partially omitted. In the writing operation, the YSEL selects one WSW from each of the COL[0] and the COL[1].

As a result, the information of the Din[0] is transmitted to one (for example, (BL[0], ZBL[0])) of the four bit-line pairs corresponding to the COL[0], and the information of the Din[0] is written to the memory cell MC positioned at the intersection point between the one bit-line pair and a separately-selected word line WL. Furthermore, in parallel to that, the information of the Din[1] is transmitted to one (for example, (BL[4], ZBL[4])) of the four bit-line pairs corresponding to the COL[1], and the information of the Din[1] is written to the MC positioned at the intersection point between the one bit-line pair and this selected WL. Here, note that the column circuits COL[0] and COL[1] corresponding to two I/O are described. However, for example, if 32 I/O are provided, similarly, the COL[0] to the COL [31] are provided. Also, here, the four bit-line pairs correspond to one I/O. However, as a matter of course, 8 or 16 bit-line pairs or others can correspond thereto.

In FIG. 8, the reading switch circuit RSW is here configured of two PMIS transistors, and, in the reading operation, connects the predetermined bit-line pair (BL, ZBL) to a complementary input node of the sense amplifier SA based on control of the column selecting circuit YSEL. Here, as similar to the WSW, one RSW is simply connected to one SA. However, practically, as illustrated in FIG. 9, a plurality of (for example, four) RSW are connected in parallel to one SA, and one RSW of them is selected via the YSEL. In the example of FIG. 9, in the column circuit COL[0], the four bit-line pairs (BL[0], ZBL[0]) to (BL[3], ZBL[3]) are connected to one SA via four RSW, respectively, so that a data output signal Dout[0] is obtained from the output of this SA. Similarly, although illustration is partially omitted, in the column circuit COL[1], the four bit-line pairs (BL[4], ZBL [4]) to (BL[7], ZBL[7]) are connected to one SA via four RSW, respectively, so that a data output signal Dout[1] is obtained from the output of this SA. In this reading operation, the YSEL selects one RSW from each of the COL[0] and the COL[1].

In FIG. 8, the sense-amplifier precharge circuit SAPRE is here configured of three PMIS transistors, and previously precharges the complementary input node of the SA at the power-supply voltage VDD in a stage prior to the driving of turning the RSW ON. The sense amplifier circuit SA is configured of, for example, an amplifier circuit of a CMIS cross-coupled type, and amplifies the signal of the complementary input node of the SA. At this time, the activation timing of the SA is determined based on the control signal from the above-described replica circuit REP. The output buffer circuit DOBF is configured of, for example, combination of a plurality of PMIS transistors and NMIS transistors, and outputs the output signal of the SA to outside as the data output signal Dout. As a result, in the example of FIG. 9, the information of the memory cell MC positioned at the intersection point between one (for example, (BL[0], ZBL [0])) of the four bit-line pairs corresponding to the COL[0] and a separately-selected word line WL is read as the Dout[0]. In parallel with that, the information of the MC positioned at the intersection point between one (for example, (BL[4], ZBL[4])) of the four bit-line pairs corresponding to the COL[1] and this selected WL is read as the Dout[1].

In FIG. 8, note that the column selecting circuit YSEL is here configured of a plurality of logical operation circuits, and selects and controls the WSW, the RSW, the BLPRE, and the SAPRE as described above based on the input signal from the column control circuit COLCTL. That is, either one of the WSW and the RSW is selected based on the identification information of the reading operation and the writing operation recognized by the COLCTL, and besides, a specific switch is driven to be turned ON from the above-described plurality of WSW or plurality of RSW based on the column selecting information recognized by the COLCTL. Moreover, in addition to this control of the WSW or the RSW, the turning on/off of each switch (MIS transistor) in the BLPRE or the SAPRE is also appropriately controlled.

<<Well Arrangement and Power-Feeding Configuration of Column Control Circuit Block (Principal Characteristics of Present First Embodiment>>

Figure 10:
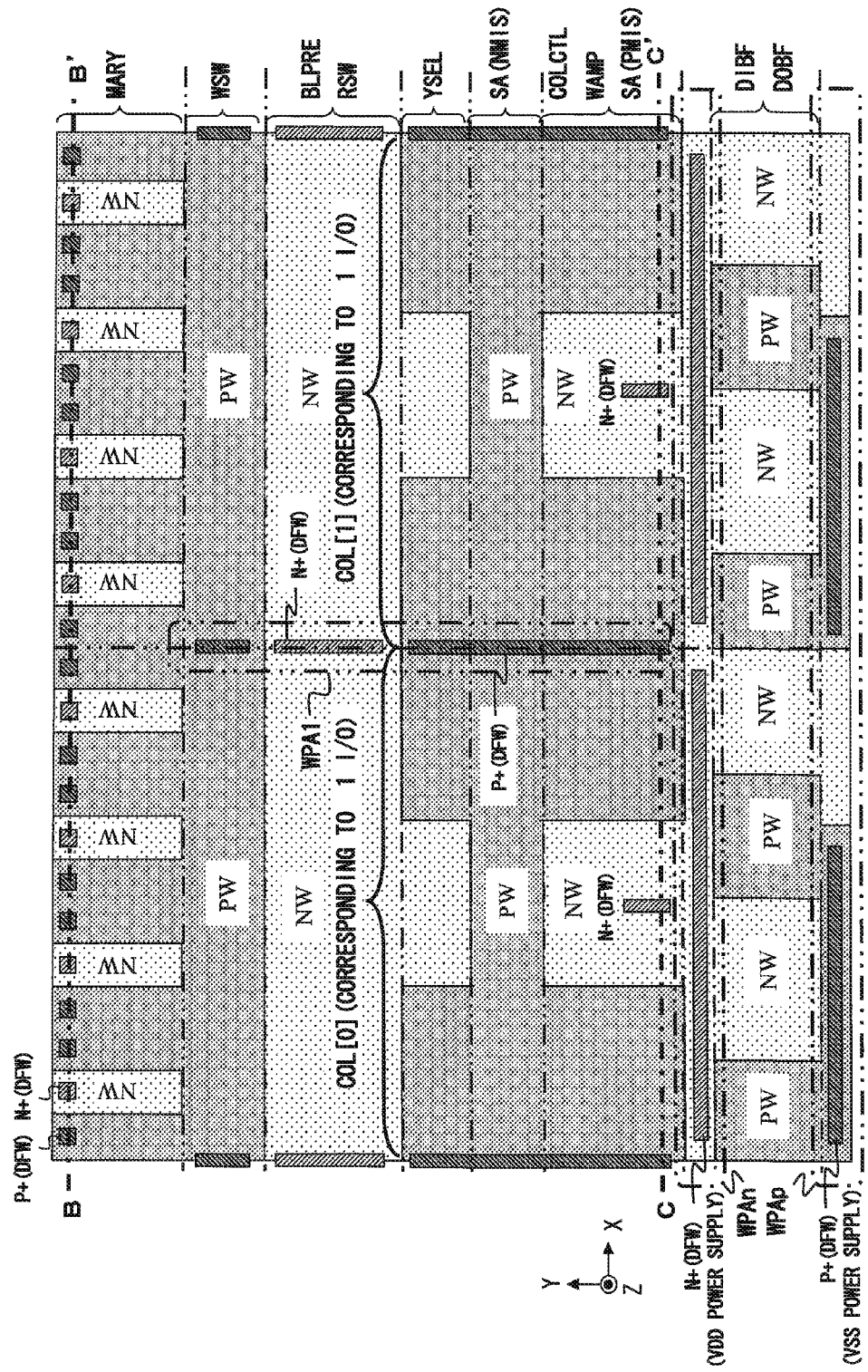
FIG. 10 is a plan view illustrating an outline layout configuration example regarding well arrangement and well power feeding in the column control circuit block of FIGS. 8 and 9.

FIG. 10 is a plan view illustrating an outline layout configuration example regarding well arrangement and well power feeding in the column control circuit block of FIGS. 8 and 9. FIG. 10 illustrates the layout configuration example of the wells and the well power feed regarding the column circuits COL[0] and COL[1] of FIG. 9 and a part of the memory array MARY connected thereto. In FIG. 10, in the Y-axis direction (the extending direction of the bit lines although not illustrated), the respective wells provided with the MARY, the WSW, the BLPRE, the RSW, the YSEL, the SA (NMIS), the COLCTL, the WAMP, the SA (PMIS), the DIBF, and the DOBF are sequentially arranged.

In the memory array MARY, as illustrated in FIGS. 5 and 7, in the X-axis direction (the extending direction of the word lines although not illustrated), the p-type wells PW and the n-type wells NW are alternately repeatedly arranged. In the writing switch circuit WSW, the PW is continuously arranged in the X-axis direction in order to form each NMIS transistor as illustrated in FIG. 8. In the bit-line precharge circuit BLPRE and the reading switch circuit RSW, the NW is continuously arranged in the X-axis direction in order to form each PMIS transistor as illustrated in FIG. 8. In the column selecting circuit YSEL, the PW and the NW are alternately arranged in the X-axis direction in order to form the various logical operation circuits (that is, CMIS-type circuits) as illustrated in FIG. 8.

In the sense amplifier circuit SA (NMIS), the PW is continuously arranged in the X-axis direction in order to form the NMIS transistor of the CMIS cross-coupled type amplifier circuit explained with FIG. 8. In the column control circuit COLCTL, the writing amplifier circuit WAMP, and the sense amplifier circuits SA (PMIS), the PW and the NW are alternately arranged in the X-axis direction in order to form the PMIS transistor and the NMIS transistor configuring each of the COLCTL and the WAMP. Furthermore, in this NW, the PMIS transistor of the SA (the CMIS cross-coupled type amplifier circuit) is formed. In the input buffer circuit DIBF and the output buffer circuit DOBF, the PW and the NW are alternately repeatedly arranged in the X-axis direction in order to form the PMIS transistors and the NMIS transistor configuring each of them.

In such well arrangement example, first, in the MARY, corresponding to PW and NW alternately arranged in the X-axis direction, a p$^+$-type semiconductor region (power-feeding diffusion layer) P+(DFW) and an n$^+$-type semiconductor region (power-feeding diffusion layer) N+(DFW) are sequentially arranged in the X-axis direction. The ground power-supply voltage VSS is supplied to each P+(DFW) arranged in each PW, so that the power is fed to each PW. Also, the power-supply voltage VDD is supplied to each N+(DFW) arranged in each NW, so that the power to is fed to each NW.

On the other hand, in the above-described regions of the WSW to the SA (PMIS), at a boundary part between the column circuits COL[0] and COL[1] which are adjacent to each other, a power feeding region WPA1 extending in the Y-axis direction is provided. The WPA1 is configured of two P+(DFW) and one N+(DFW) each having a substantially elongate rectangular shape whose long side is in the Y-axis direction. One of the two P+(DFW) is arranged in the PW in the region of the WSW, and the other is arranged in the PW in the regions of the YSEL to the SA (PMIS). One N+(DFW) is arranged in the NW in the regions of the BLPRE and the RSW. The VSS is supplied to the two P+(DFW), and the VDD is supplied to the one N+(DFW), so that the power is fed to the corresponding PW and NW. As described above, when the column circuits whose numbers correspond to the number of the I/O are tried to be repeatedly arranged by using the memory compiler or others, the WPA1 can be shared between the column circuits on both sides thereof by arranging the power feeding region WPA1 at the boundary part between the column circuits, and therefore, area efficiency can be improved.

Here, in the well arrangement example of FIG. 10, furthermore, power feeding regions WPAn and WPAp extending in the X-axis direction are provided on both sides of each region of the DIBF and the DOBF in the Y-axis direction. These WPAn and WPAp are one of principal characteristics of the present first embodiment. The WPAn is arranged between the region of the DIBF/DOBF and the region of the SA (PMIS) or others, and includes: an n-type well NW continuously extending in the X-axis direction so as to longitudinally cross the COL[0] and the COL[1]; and an n$^+$-type semiconductor region (power-feeding diffusion layer) N+(DFW) formed in this NW. This NW is joined to each of the NW in the above-described region of the SA (PMIS) or others and the NW in the regions of the DIBF and the DOBF. The VDD is supplied to this N+(DFW), so that the power is fed to the NW in the region of the SA (PMIS) or others and the NW in the regions of the DIBF and the DOBF. In the example of FIG. 10, note that the N+(DFW) to which the VDD is supplied is separately formed in this NW for the SA (PMIS) in order to further advance the above-described power feeding from the WPAn to the NW for the SA (PMIS).

On the other hand, the WPAp is arranged at a position opposed to the WPAn so as to interpose the regions of the DIBF and the DOBF therebetween in the Y-axis direction, and includes: a p-type well PW extending in the X-axis direction in the COL[0]; a p$^+$-type semiconductor region (power-feeding diffusion layer) P+(DFW) formed in this PW; a PW extending in the X-axis direction in the COL[1]; and a P+(DFW) formed in this PW. The PW in the WPAp which corresponds to the COL[0] is joined to the PW in the regions of the DIBF and the DOBF corresponding to the COL[0], and the PW in the WPAp which corresponds to the COL[1] is joined to the PW in the regions of the DIBF and the DOBF corresponding to the COL[1]. The VSS is supplied to each P+(DFW) in the WPAp, so that the power is fed to each PW in the regions of the DIBF and the DOBF.

Figure 11:
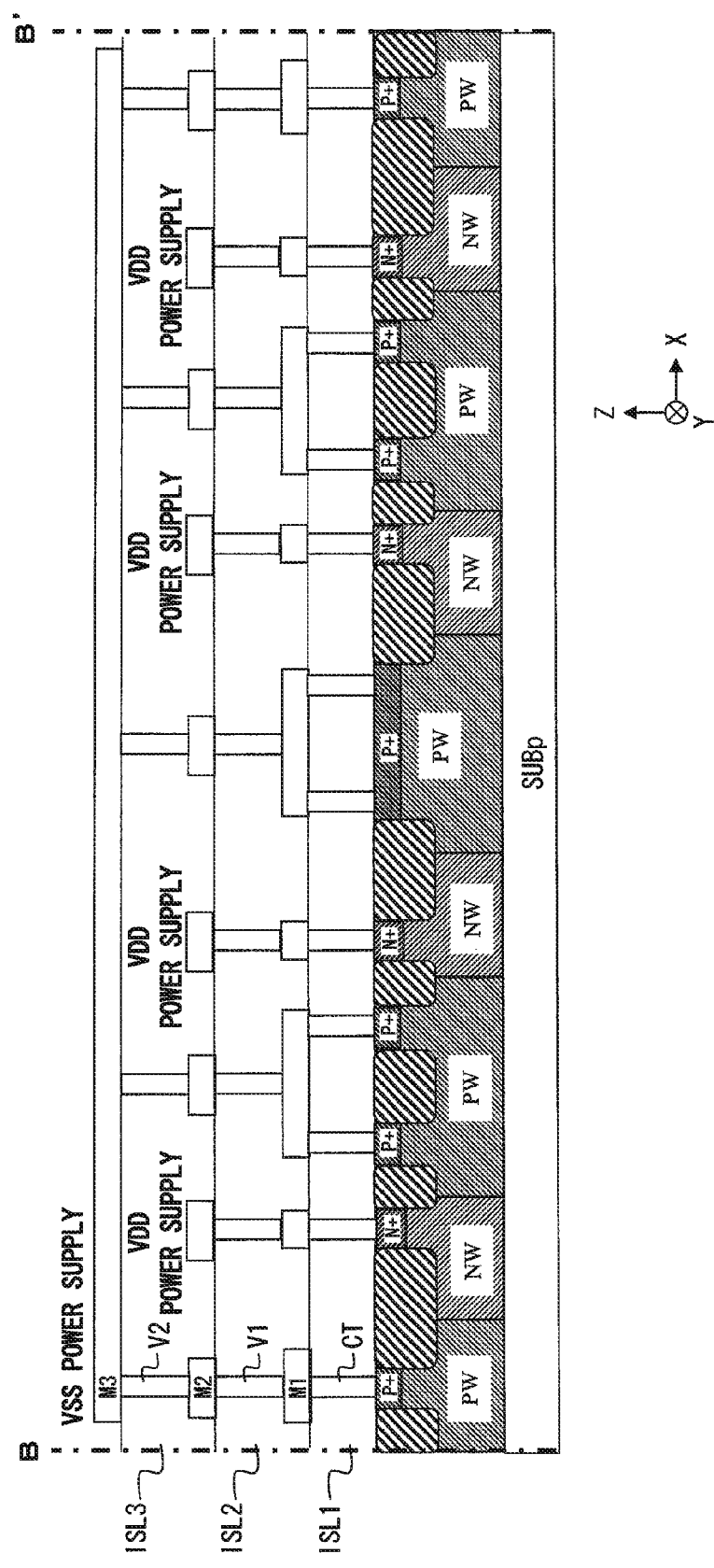
FIG. 11 is a cross-sectional view illustrating an outline device structure example of a part between B-B' of the layout of FIG. 10.

FIG. 11 is a cross-sectional view illustrating an outline device structure example of a part between B-B' in the layout of FIG. 10. FIG. 11 illustrates a device structure example of a power feeding part regarding the memory array MARY of FIG. 10, and illustrates not only the well and the power feeding part thereof illustrated in FIG. 10 but also the device structure thereabove (in the Z-axis direction). In FIG. 11, on the p-type semiconductor substrate SUBp, the p-type well PW and the n-type well NW are alternately continuously arranged along the X-axis direction. On the principal surface of the semiconductor substrate, the p$^+$-type semiconductor region (power-feeding diffusion layer) P+(DFW) is formed in each PW, and the n$^+$-type semiconductor region (power-feeding diffusion layer) N+(DFW) is formed in each NW. Moreover, on the principal surface of the semiconductor substrate, the buried insulating film (element isolation film) STI is formed in the PW and the NW. The STI is formed so as to surround each of the N+(DFW) and the P+(DFW) on the XY plane.

An interlayer insulating film ISL1 is deposited on the principal surface of the semiconductor substrate, and a plurality of contact layers CT are formed in the ISL1. Each of one ends of some of the plurality of CT is connected to the P+(DFW) in each PW, and each of one ends of the others of the plurality of CT is connected to the N+(DFW) in each NW described above. A first metal wiring layer M1 is formed on the ISL1, and an interlayer insulating film ISL2 is deposited on the ISL1 and the M1. A second metal wiring layer M2 are formed on the ISL2, and an interlayer insulating film ISL3 is deposited on the ISL2 and the M2. A third metal wiring layer M3 is formed on the ISL3. Moreover, a first via layer V1 for connecting the M1 and the M2 is formed in the ISL2, and a second via layer V2 for connecting the M2 and the M3 is formed in the ISL3.

Here, in each CT described above whose one end is connected to the P+(DFW) in each PW, the other end thereof is connected to the M3 sequentially via the M1, the V1, the M2, and the V2. Here, this M3 is one wire extending in the X-axis direction, and the above-described P+(DFW) in each PW is commonly connected to this M3. The ground power-supply voltage VSS is supplied to this M3. On the other hand, in each CT described above whose one end is connected to the N+(DFW) in each NW, the other end thereof is connected to the M2 sequentially via the M1 and the V1. Here, this M2 is a plurality of wires each extending in the Y-axis direction so as to be along each other. However, the plurality of wires M2 are commonly connected in a region not illustrated. The power-supply voltage VDD is supplied to this M2.

Figure 12:
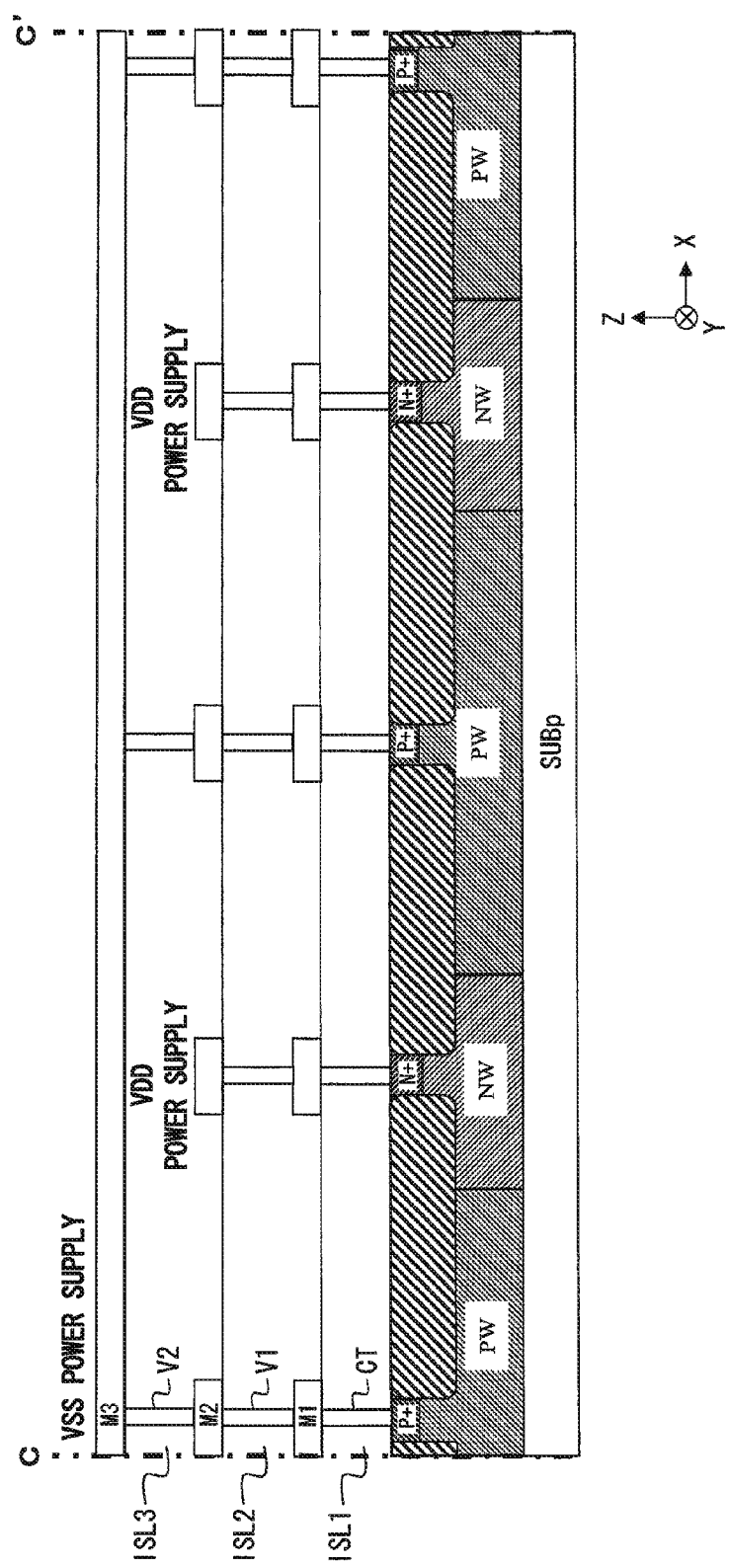
FIG. 12 is a cross-sectional view illustrating an outline device structure example of a part between C-C' of the layout of FIG. 10.

FIG. 12 is a cross-sectional view illustrating an outline device structure example of a part between C-C' in the layout of FIG. 10. FIG. 12 illustrates a device structure example of a power feeding part regarding the regions of the COLCTL, the WAMP, and the SA (PMIS) of FIG. 10, and illustrates not only the well and the power feeding part thereof illustrated in FIG. 10 but also the device structure thereabove (in the Z-axis direction). Although the device structure example of FIG. 12 is different from the above-described device structure example of FIG. 11 in the number of the alternately-arranged wells, a basic structure except for this is similar to the case of FIG. 11.

<<Details of Method of Well Power Feeding (Details of Principal Characteristics and Effects of Present First Embodiment>>

Figure 13:
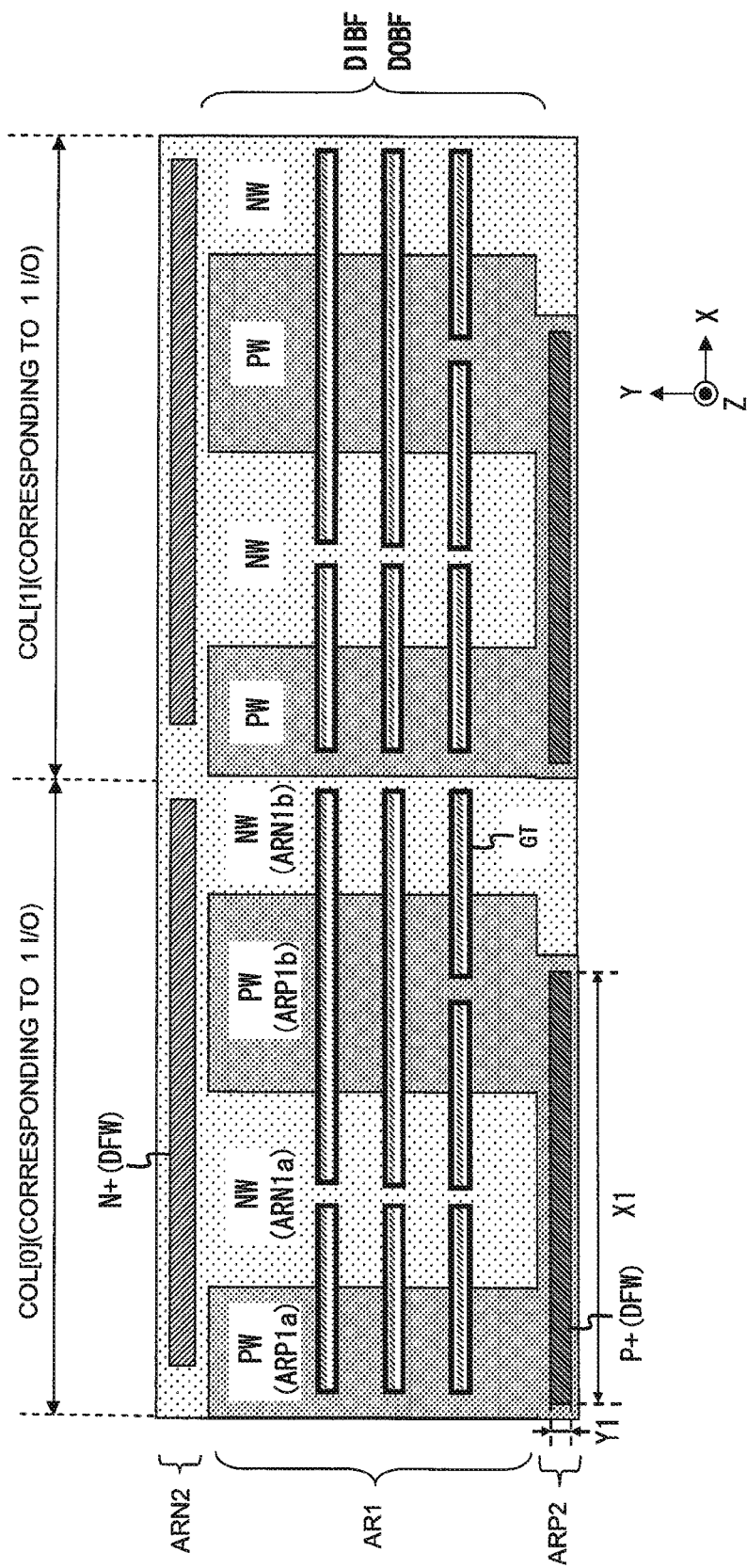
FIG. 13 is a plan view illustrating a basic concept of well arrangement and well power feeding method in the semiconductor device according to the first embodiment of the present invention.

FIG. 13 is a plan view illustrating a basic concept of the well arrangement and the method of the well power feeding of the semiconductor device of the first embodiment of the present invention. In FIG. 13, peripheries of the regions of the DIBF and the DOBF in FIG. 10 are extracted, and there are such characteristics that the p-type well PW includes a first part AR1 and a second part ARP2, and that the n-type well NW includes the first part AR1 and a second part ARN2. In the layout configuration of FIG. 13, schematically, the plurality of PW and NW are alternately arranged along the X-axis direction in the AR1 to be adjacent to each other, a common power feeding region (second part ARP2) for the plurality of PW is arranged on one side of the AR1 sandwiched in the Y-axis direction, and a common power feeding region (second part ARN2) for the plurality of NW is arranged on the other side thereof.

In the AR1, along the X-axis direction, a first A part ARP1a of the PW, a first A part ARN1a of the NW, a first B part ARP1b of the PW, and a first B part ARN1b of the NW are sequentially arranged to be adjacent to each other. The second part ARP2 of the PW has an elongate belt-like shape extending in the X-axis direction, and is arranged to be joined to the ARP1a and the ARP1b and be adjacent to the ARN1a in the Y-axis direction. The second part ARN2 of the NW has an elongate belt-like shape extending in the X-axis direction, and is arranged to be joined to the ARN1a and the ARN1b and be adjacent to the ARP1b on the side opposed to the ARP2 so as to interpose the ARN1a, the ARP1b, and the ARN1b therebetween in the Y-axis direction.

Here, in the second part ARP2 of the PW, a $p^+$-type semiconductor region (power-feeding diffusion layer) P+(DFW) is formed. The P+(DFW) has a substantially rectangular shape having a size X1 in the X-axis direction larger than a size Y1 in the Y-axis direction in order to sufficiently feed the power to the ARP1a and the ARP1b. In other words, the P+(DFW) includes a zone opposed to the ARN1a in the Y-axis direction, the ARN1a being sandwiched between the ARP1a and the ARP1b. Similarly, in the second part ARN2 of the NW, an $n^+$-type semiconductor region (power-feeding diffusion layer) N+(DFW) is formed. The N+(DFW) has a substantially rectangular shape having a size in the Y-axis direction larger than a size in the X-axis direction in order to sufficiently feed the power to the ARN1a and the ARN1b. In other words, the N+(DFW) includes a zone opposed to the ARP1b in the Y-axis direction, the ARP1b being sandwiched between the ARN1a and the ARN1b.

Also, in the first part AR1, the plurality of gate layers GT extending in the X-axis direction are arranged. The plurality of GT layers are arranged so as to cross at least any one of a boundary part between the ARP1a and the ARN1a, a boundary part between the ARN1a and the ARP1b, and a boundary part between the ARP1b and the ARN1b. Although not illustrated, note that the source/drain regions using the GT as a gate of a MIS transistor are appropriately formed in a part on both sides so as to interpose the GT therebetween in the Y-axis direction. The source/drain regions serve as $n^+$-type semiconductor regions (diffusion layers) in the PW (ARP1a, ARP1b), and serve as $p^+$-type semiconductor regions (diffusion layers) in the NW (ARN1a, ARN1b).

Furthermore, as described with FIG. 10, etc., in FIG. 13, the plurality of column circuits COL[0] and COL[1] are sequentially arranged along each other in the X-axis direction, and each of the column circuit includes the above-described first part (ARP1a, ARP1b) and the second part ARP2 of the PW and the first part (ARN1a, ARN1b) and the second part ARN2 of the NW. Here, in accordance with this repeated arrangement of the column circuits, the second part ARN2 of the NW is continued between the column circuits in the X-axis direction. On the other hand, the power-feeding diffusion layer N+(DFW) in the ARN2 is not continued between the column circuits here. However, as a matter of course, it can be continued therebetween.

In FIG. 13, note that each of the PW (ARP1a, ARP1b) and the NW (ARN1a, ARN1b) included in the first part AR1 has both sides so as to be along each other to extend on straight lines in the Y-axis direction. However, it is not always necessary to form the both sides on the straight lines, but the both sides may have, for example, such stepwise shapes as extending in the Y-axis direction. That is, for example, in a case that a plurality of NMIS transistors are sequentially formed in the Y-axis direction in the ARP1a of the PW, and besides, in a case that the transistor sizes of the NMIS transistors are different from each other, area efficiency can be improved in some cases by appropriately changing the size of the PW in the X-axis direction (that is, a gate width thereof) so as to depend on the position in the Y-axis direction in accordance with this size difference. Also, in each column circuit, each of the power-feeding diffusion layers P+(DFW) and N+(DFW) is achieved by one continuous linear pattern. However, depending on cases, they can be achieved by a plurality of linear patterns by appropriately dividing the one linear pattern at any position in the X-axis direction. However, it is desired to increase the areas of the P+(DFW) and the N+(DFW) as large as possible, and therefore, they are desired to be achieved by the one linear pattern.

Figure 14A:
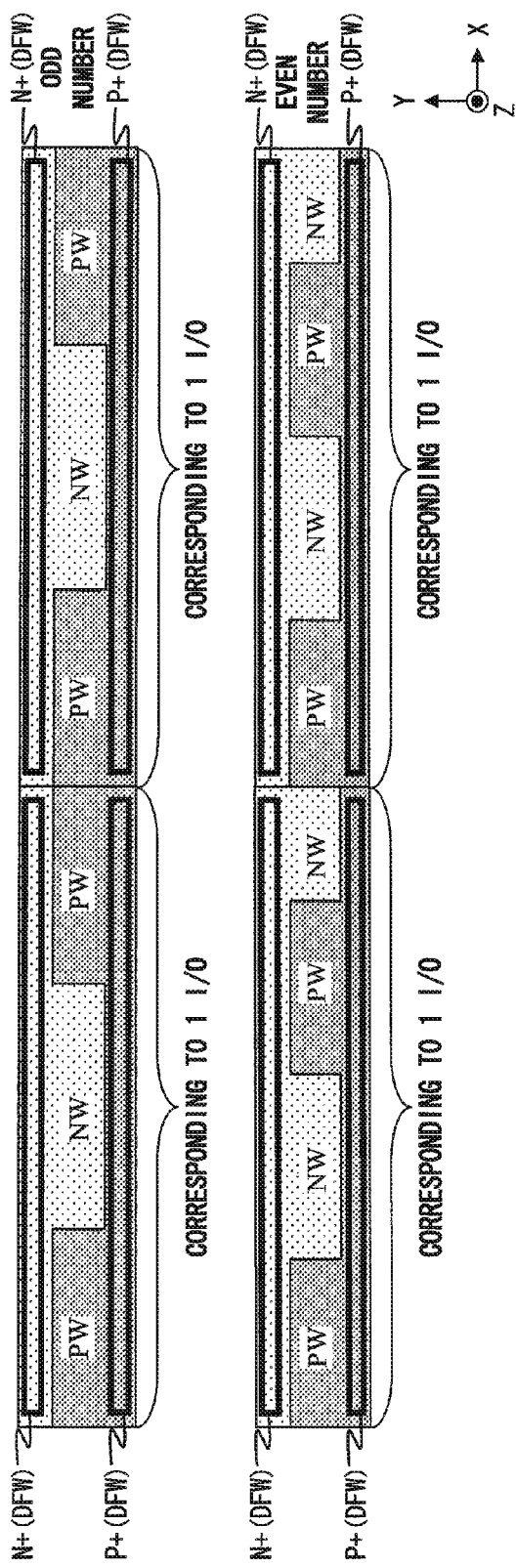
FIGS. 14A and 14B are an explanatory diagram illustrating an example of effects of the well arrangement and the well power feeding method of FIG. 13 and an explanatory diagram illustrating a comparison example with FIG. 14A, respectively.
Figure 14B:
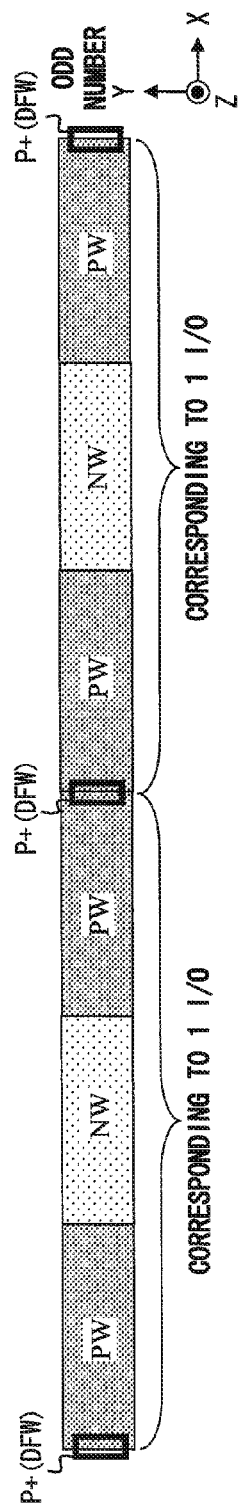
Figure 15A:
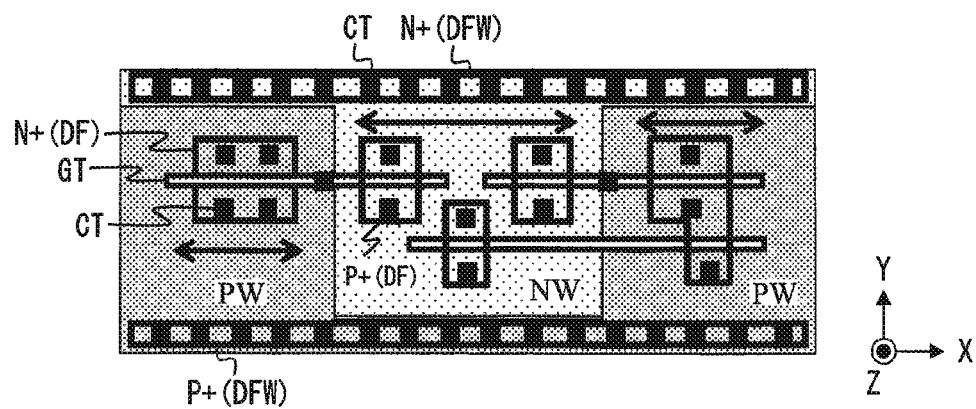
FIGS. 15A and 15B are an explanatory diagram illustrating an example of effects of the well arrangement and the well power feeding method of FIG. 13 and an explanatory diagram illustrating a comparison example with FIG. 15A, respectively.
Figure 15B:
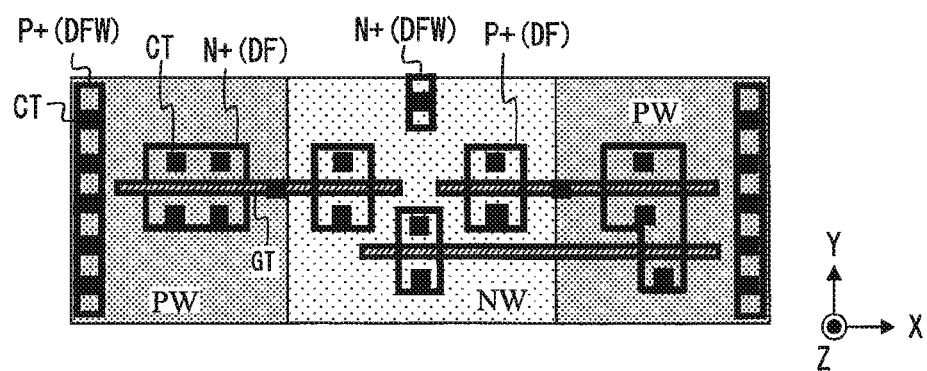
Figure 16A:
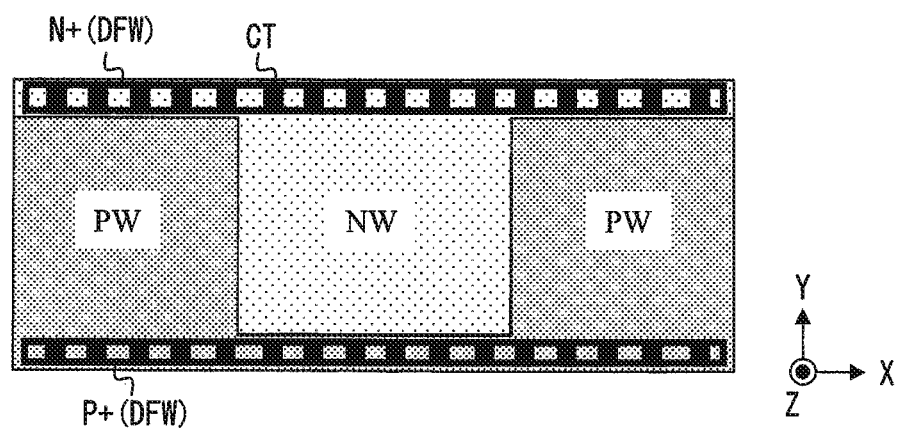
FIGS. 16A and 16B are an explanatory diagram illustrating an example of effects of the well arrangement and the well power feeding method of FIG. 13 and an explanatory diagram illustrating a comparison example with FIG. 16A, respectively.
Figure 16B:
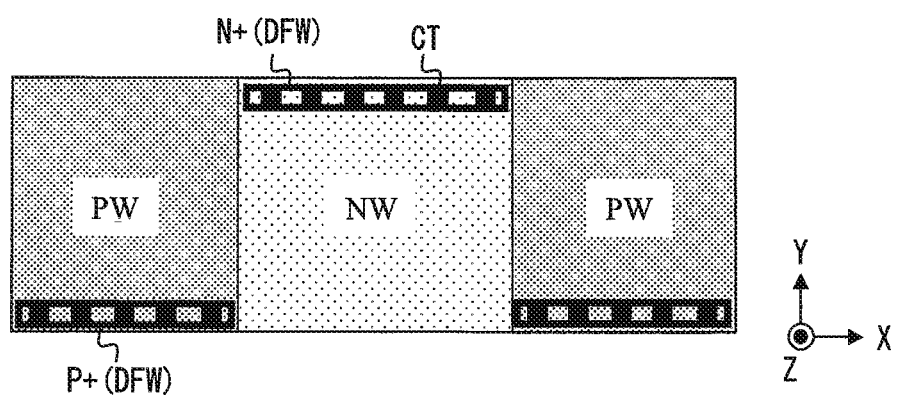

By using such well arrangement and well power feeding method, such effects as the following items (1) to (3) are obtained. Each of FIGS. 14A, 15A, and 16A is an explanatory diagram illustrating one example of the effects of the well arrangement and the well power feeding method in FIG. 13, and each of FIGS. 14B, 15B, and 16B is an explanatory diagram illustrating comparative example of each of FIGS. 14A, 15A, and 16A.

(1) When a certain unit layout is repeatedly arranged in the X-axis direction, the number of wells in the unit layout is not limited, and therefore, the degree of freedom of the layout is improved, and the area of the semiconductor device can be reduced as a result. That is, as illustrated in, for example, FIG. 14B, when a part corresponding to one I/O is repeatedly arranged in the X-axis direction as the unit layout, if a method in which the power-feeding diffusion layer (here, the P+(DFW)) is provided at a boundary part between the I/O is used, it is required to set the number of the wells in the unit layout to be an odd number. That is, in the alternate arrangement of the p-type well PW and the n-type well NW in the X-axis direction in the unit layout, it is required to arrange both sides of the alternate arrangement to be the PW or the NW. Accordingly, if the method as illustrated in FIG. 13 is used, whether the number of the wells in the unit layout is an odd number or an even number as illustrated in FIG. 14A, the repeated arrangement in the X-axis direction can be used without any problem.

(2) In each well, the transistor size of each transistor formed therein can be selected from a wide range (that is, the degree of freedom of the layout is improved), and the area of the semiconductor device can be reduced as a result. That is, for example, in the comparative example illustrated in FIG. 15B, for the PW and the NW alternately arranged in the X-axis direction, the power-feeding diffusion layers P+(DFW) and N+(DFW) extending in the Y-axis direction are provided. In the PW and the NW, the MIS transistor is appropriately formed, and it is desired to extend the gate layer GT of the MIS transistor in the X-axis direction so as to, for example, match the extending direction of the gate layer of the SRAM memory cell illustrated in FIG. 5. The $n^+$-type semiconductor region (diffusion layer) N+(DF) serving as the source/drain of the NMIS transistor is formed on both sides of the GT in the PW, and the $p^+$-type semiconductor region (diffusion layer) P+(DF) serving as the source/drain of the PMIS transistor is formed on both sides of the GT in the NW.

Here, the sizes of each PMIS transistor and each NMIS transistor are adjusted by the gate widths, and these gate widths correspond to the sizes of the N+(DF) and the P+(DF) in the X-axis direction. Accordingly, if the power-feeding diffusion layers P+(DFW) and N+(DFW) extending in the Y-axis direction are provided as illustrated in FIG. 15B, they become bottlenecks, and therefore, the increase in the sizes of the N+(DF) and P+(DF) in the X-axis direction is difficult. Particularly, in the column circuits COL[0] and COL[1] as illustrated in FIGS. 10 and 13, the largest size of each column circuit in the X-axis-direction is limited to the size of the SRAM memory cell in the memory array MARY in the X-axis direction (in the example of FIG. 10, the size corresponding to the four SRAM memory cells). In this case, the ensuring of the transistor size by simply increasing the size of the PW and NW itself in the X-axis direction is difficult. Accordingly, when the method as illustrated in FIG. 13 is used, the above-described bottlenecks (which are the power-feeding diffusion layers in the Y-axis direction) are eliminated as illustrated in FIG. 15A, and therefore, the respective N+(DF) and P+(DF) in the PW and the NW can be sufficiently widened in the X-axis direction.

(3) Since the area of the power-feeding diffusion layer itself can be sufficiently ensured, for example, tolerance against the latchup or others is improved, so that the reliability of the semiconductor device can be improved. That is, in order to solve the problems described above in the items (1) and (2), it is considered that, for example, a method as illustrated in FIG. 16B is used. In a comparative example of FIG. 16B, the power-feeding diffusion layer P+(DFW) extending in the X-axis direction is arranged on one end of each PW in the Y-axis direction, and, the power-feeding diffusion layer N+(DFW) extending in the X-axis direction is arranged on the other end of each NW in the Y-axis direction. However, in this case, the areas of the power-feeding diffusion layers (or area ratios (="the areas of the power-feeding diffusion layers/the areas of the wells")) are small. Accordingly, when the method as illustrated in FIG. 13 is used, the areas of the power-feeding diffusion layers can be increased as illustrated in FIG. 16A to be larger than that in the case of FIG. 16B.

As described above, by using the semiconductor device of the present first embodiment, typically, a semiconductor device with a high degree of freedom of the layout can be achieved. As a result, the area of the semiconductor device can be reduced.

Second Embodiment

<<Details of Well Power-Feeding Method (First Modification Example)>>

Figure 17:
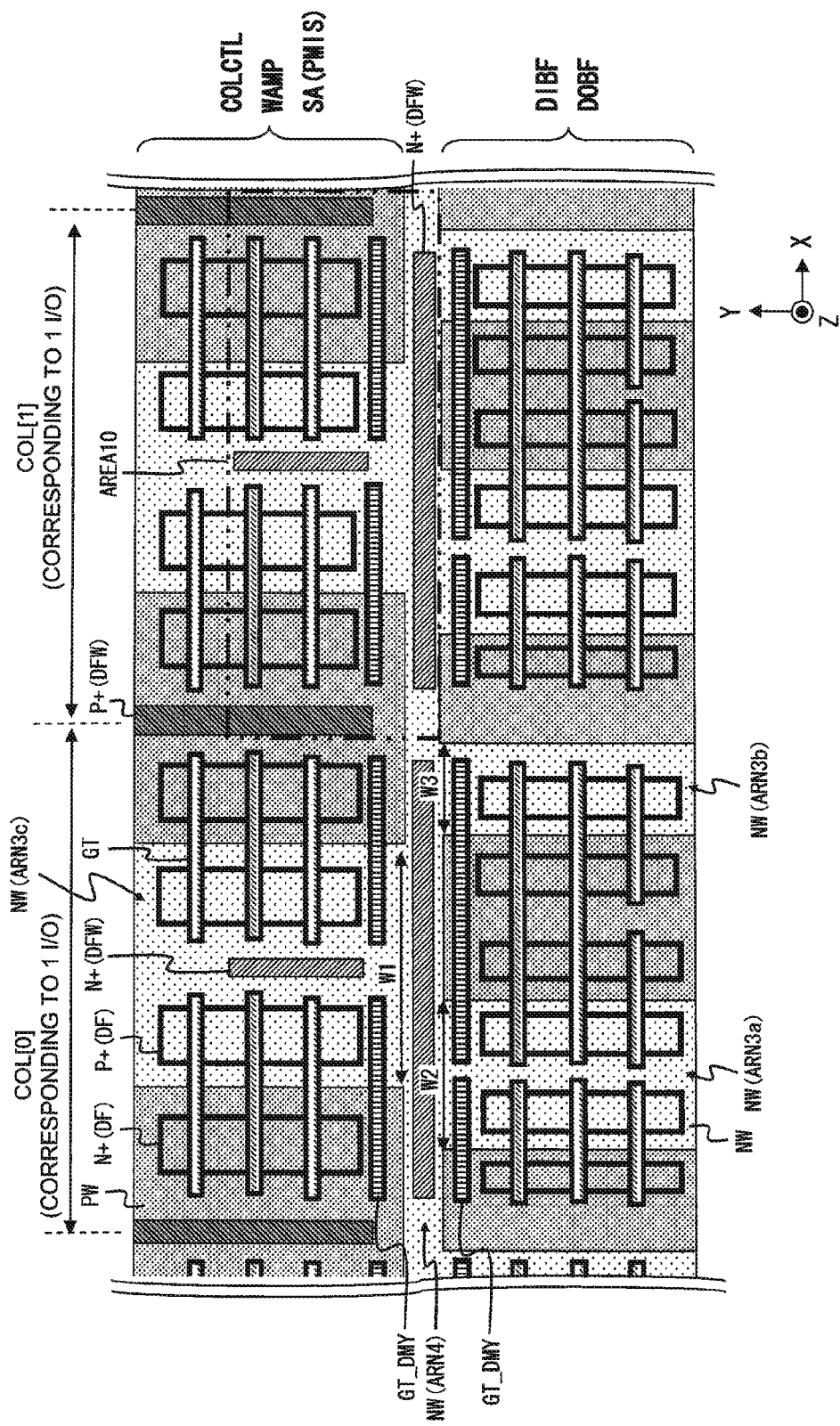
FIG. 17 is a plan view illustrating an outline configuration example of well arrangement and well power feeding method in a semiconductor device according to the second embodiment of the present invention.

FIG. 17 is a plan view illustrating an outline configuration example of a well arrangement and a well power-feeding method of a semiconductor device according to the second embodiment of the present invention. The semiconductor device illustrated in FIG. 17 is obtained by extracting the regions from the regions of the COLCTL, the WAMP, the SA (PMIS) to the regions of the DIBF and the DOBF in FIG. 10. FIG. 17 has such characteristics that the power feeding region extending in the X-axis direction as described in the first embodiment feeds the power to the wells positioned on both sides in the Y-axis direction, that a dummy gate layer is provided on both sides in the Y-axis direction of the power feeding region extending in the X-axis direction, and that a power feeding region extending in the Y-axis direction is further combined with the power feeding region extending in the X-axis direction.

In FIG. 17, an n-type well NW includes: a fourth part ARN4 having an elongate belt-like shape extending in the X-axis direction; a third A part ARN3*a* and a third B part ARN3*b* arranged on one side so as to interpose the ARN4 in the Y-axis direction and having a part joined to the ARN4; and a third C part ARN3*c* arranged on the other side so as to interpose the ARN4 in the Y-axis direction and having a part joined to the ARN4. The ARN3*a* and the ARN3*b* are arranged so as to interpose a p-type well PW therebetween in the X-axis direction, and this PW is arranged to be adjacent to the ARN4 in the Y-axis direction. Also, the p-type well PW is arranged on both sides of the ARN3*c* in the X-axis direction, and these PW are arranged to be adjacent to the ARN4 in the Y-axis direction.

In FIG. 17, the length W1 of the joint part between the ARN4 and the ARN3*c* is different from the length W2 of the joint part between the ARN4 and the ARN3*a*, and besides, from the length W3 of the joint part between the ARN4 and the ARN3*b*. Also, in each column circuit (for example, COL[0]), the number of the NW arranged on one side so as to interpose the ARN4 in the Y-axis direction is different from the number of the NW arranged on the other side (in the example of FIG. 17, one part and two parts). In the ARN4, the $n^+$-type semiconductor region (power-feeding diffusion layer) N+(DFW) is arranged, and the power is fed to the ARN3*a*, the ARN3*b*, and the ARN3*c* via the N+(DFW) and the NW. As described above, by feeding the power from the power feeding region (ARN4) extending in the X-axis direction to the wells provided on both sides in the Y-axis direction, the power feeding region can be shared between the wells on the both sides, and therefore, the area efficiency can be improved. Moreover, as illustrated in FIG. 17, it is beneficial to arrange the ARN4 particularly at a place where the widths of the wells (the sizes thereof in the X-axis direction) are different from each other in the course of advancing in the Y-axis direction or a place where the numbers of the wells are different from each other therein. In this manner, the degree of freedom of the layout can be improved (that is, the well widths and the number of the wells can be flexibly changed), and the area efficiency can be improved.

Moreover, in FIG. 17, as also described with FIG. 13, the plurality of gate layers GT which are along each other so as to extend in the X-axis direction and so as to cross the boundary part between the PW and the NW and the diffusion layers serving as the source/drain regions (the $n^+$-type semiconductor region (diffusion layer) N+(DF) in the PW, and the $p^+$-type semiconductor region (diffusion layer) P+(DF) in the NW) of the GT are arranged. Here, on the both sides of the ARN4 in the Y-axis direction, a dummy gate layer GT_DMY which is along the GT so as to extend in the X-axis direction is provided between the ARN4 and the GT. The GT_DMY is different from the GT in that it is not functioned as the gate of the MIS transistor. More specifically, the GT_DMY does not include the diffusion layer which serves as the source/drain region on the ARN4 side thereof. By providing the ARN4 as illustrated in FIG. 17, a pattern density of the GT in vicinity of this ARN4 is changed, which results in a risk of increase in manufacturing variations. However, by providing the GT_DMY as described above, the pattern density can be uniformed to some extent, so that the processing accuracy of the manufacturing process can be sufficiently maintained.

Furthermore, in FIG. 17, a $p^+$-type semiconductor region (power-feeding diffusion layer) P+(DFW) extending in the Y-axis direction is arranged in the PW at the boundary part between the column circuits COL[0] and COL[1], and an $n^+$-type semiconductor region (power-feeding diffusion layer) N+(DFW) extending in the Y-axis direction is arranged in the third C part (ARN3c) of each of the column circuits. Each of the P+(DFW) and N+(DFW) has a substantially rectangular shape having a size in the Y-axis direction larger than a size in the X-axis direction. As described above, by using combination of the power feeding region extending in the X-axis direction and the power feeding region extending in the Y-axis direction, the power is sufficiently and more efficiently fed to the wells in some cases.

For example, if the device is configured with only the power feeding regions all of which extend in the X-axis direction without using the power feeding regions extending in the Y-axis region, for example, the following points are concerned. First, if the power feeding regions extending in the X-axis direction are used, there is a risk that the well sizes in the Y-axis direction slightly increase. Therefore, for example, if the size in the semiconductor device in the Y-axis direction is limited, it is beneficial to appropriately use the power feeding region extending in the Y-axis direction in addition to that in the X-axis direction. Next, if the power feeding region extending in the X-axis direction is used, for example, in a case that the size in the Y-axis direction of the well serving as a power feeding target of the power feeding region is large, a part that is distant from the power feeding region is caused in the well, and therefore, there is a risk of insufficient power feeding ability. Also in such a case, it is beneficial to appropriately use the power feeding region extending in the Y-axis direction in addition to that in the X-axis direction. Moreover, as described with FIG. 14, in addition to these points, if the number of the wells in a certain repeated unit is the odd number, the degree of freedom (area efficiency) of the layout can be sufficiently ensured in some cases also in the power feeding region extending in the Y-axis direction. Also in such a case, it is beneficial to appropriately use the power feeding region extending in the Y-axis direction.

In the example of FIG. 17, the N+(DFW) in the ARN3c is provided in order to further enhance the power feeding ability for, for example, the SA (PMIS). Also, the P+(DFW) at the boundary part between the COL[0] and the COL[1] is provided in order to sufficiently feed the power particularly to the NMIS transistor in the WAMP, and besides, to achieve the sufficient area efficiency to some extent. That it, since the number of the wells in each of the column circuits is the odd number in the region of the WAMP or others as described with FIG. 14, the power feeding region can be arranged at the boundary part between the column circuits, so that the power feeding region can be shared between the column circuits on both sides thereof, and therefore, the area efficiency can be sufficiently ensured.

<<Detailed Device Structure of Semiconductor Device of Present Second Embodiment>>

Figure 18:
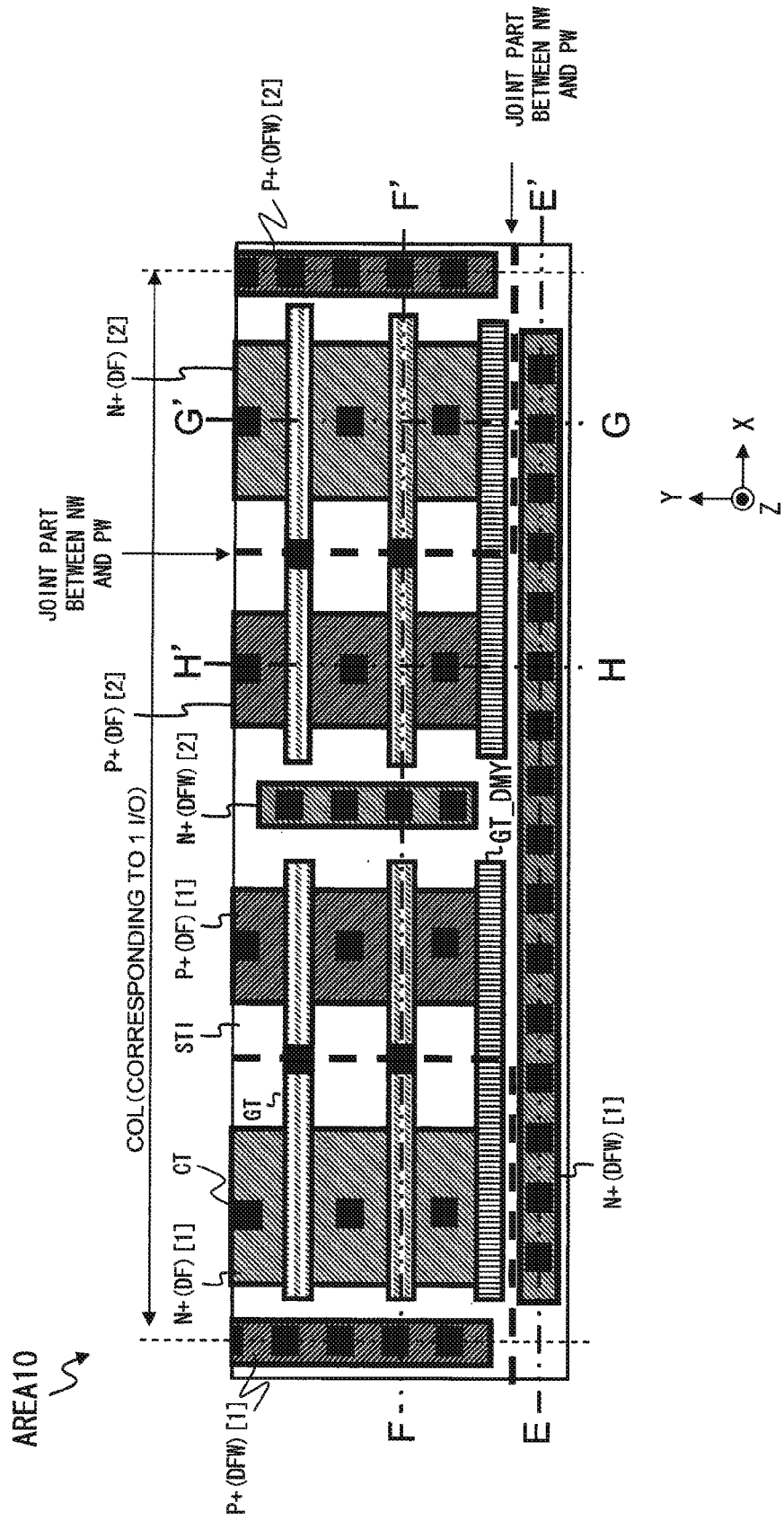
FIG. 18 is a plan view illustrating a more detailed configuration example of a partial region of the semiconductor device of FIG. 17.
Figure 20A:
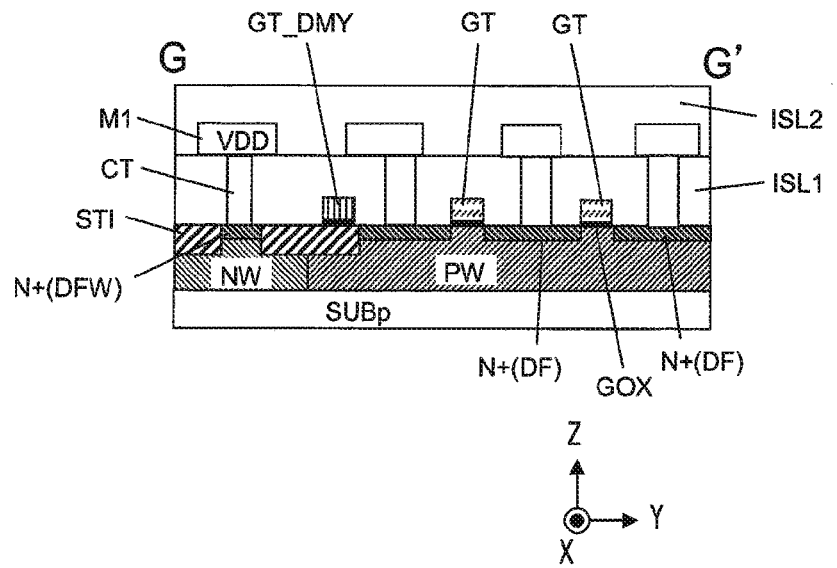
FIGS. 20A and 20B are a cross-sectional view illustrating an outline device structure example of a part between G-G' in FIG. 18 and a cross-sectional view illustrating an outline device structure example of a part between H-H' in FIG. 18, respectively.
Figure 20B:
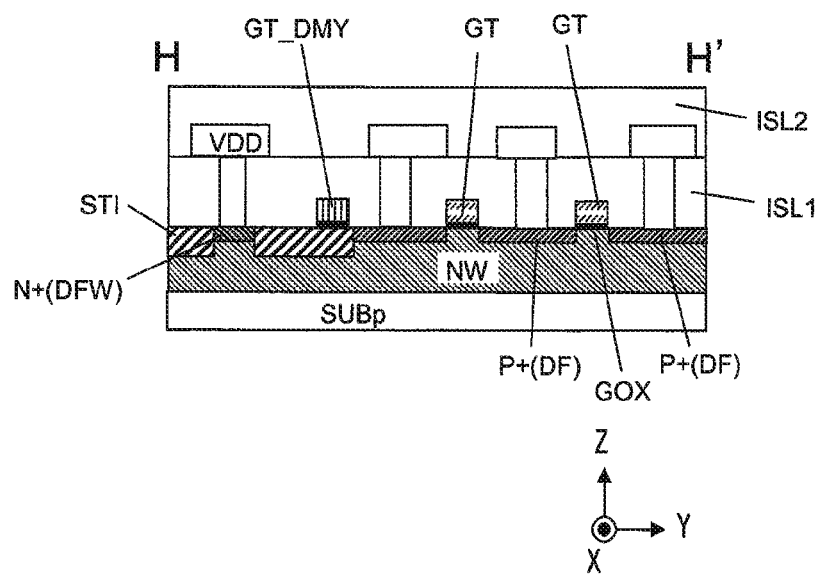

FIG. 18 is a plan view illustrating a more detailed configuration example of a partial region of the semiconductor device of FIG. 17. FIG. 19A is a cross-sectional view illustrating an outline device structure example of a part between E-E' in FIG. 18, FIG. 19B is a cross-sectional view illustrating an outline device structure example of a part between F-F' in FIG. 18. FIG. 20A is a cross-sectional view illustrating an outline device structure of a part between G-G' in FIG. 18, and FIG. 20B is a cross-sectional view illustrating an outline device structure example of a part between H-H' in FIG. 18.

The configuration example illustrated in FIG. 18 is obtained by extracting an AREA 10 in FIG. 17 and shaping the area in more detail. FIG. 18 illustrates a range of one column circuit COL in the X-axis direction, the $p^+$-type semiconductor regions (power-feeding diffusion layers) P+(DFW) [1] and [2] each extending in the Y-axis direction are arranged at the boundary part of this column circuit the in X-axis-direction. Between the two P+(DFW) [1] and [2], an $n^+$-type semiconductor region (diffusion layer) N+(DF) [1], a $p^+$-type semiconductor region (diffusion layer) P+(DF) [1], an $n^+$-type semiconductor region (power-feeding diffusion layer) N+(DFW) [2], a $p^+$-type semiconductor region (diffusion layer) P+(DF) [2], and an $n^+$-type semiconductor region (diffusion layer) N+(DF) [2] are sequentially arranged along the X-axis direction. The N+(DFW) [2] has a shape extending in the Y-axis direction. Moreover, an $n^+$-type semiconductor region (power-feeding diffusion layer) N+(DFW) [1] extending in the X-axis direction is arranged so as to be opposed to the N+(DF) [1], the P+(DF) [1], the N+(DFW) [2], the P+(DF) [2], and the N+(DF) [2] in the Y-axis direction.

The P+(DFW) [1] and the N+(DF) [1] are formed in the p-type well PW, and the P+(DF) [1], the N+(DFW) [2], the P+(DF) [2], and the N+(DFW) [1] are formed in the n-type well NW, and the P+ (DFW) [2] and the N+(DF) [2] are formed in the p-type well PW. Accordingly, a joint part between the NW and the PW is formed. However, in practice, each of the diffusion layers and the power-feeding diffusion layers is formed so as to be exposed from the buried insulating film (element isolation film) STI on the X-Y plane, and therefore, the joint part between the NW and the PW is formed below the STI (in the Z-axis direction).

Above the N+(DF) [1] and the P+(DF) [1] (in the Z-axis direction), a plurality of (here, two) gate layers GT which are along each other so as to cross the joint part between the PW and the NW and to extend in the X-axis direction are arranged. The N+(DF) [1] and the P+(DF) [1] become the source and drain regions of the GT. Furthermore, between the GT and the N+(DFW) [1], the dummy gate layer GT_DMY which is along the GT so as to extend in the X-axis direction is arranged. The GT_DMY is not functioned as the gate of the MIS transistor, and there is no diffusion layer serving as the source/drain regions on the N+(DFW) [1] side of the GT_DMY. Similarly, above the N+(DF) [2] and the P+(DF) [2] (in the Z-axis direction), a plurality of (here, two) gate layers GT which are along each other so as to extend in the X-axis direction and so as to cross the joint part between the PW and the NW are arranged. The N+(DF) [2] and the P+(DF) [2] serve as the source and drain regions of the GT. Furthermore, between the GT and the N+(DFW) [1], the dummy gate layer GT_DMY which is along the GT so as to extend in the X-axis direction but is not functioned as the MIS transistor is arranged. Moreover, above each diffusion layer, each power-feeding diffusion layer, and each gate layer (in the Z-axis direction), a contact layer CT is appropriately arranged.

FIG. 19A illustrates a cross-sectional configuration example obtained by cutting the region of the power-feeding diffusion layer N+(DFW) [1] in FIG. 18 on a line in the X-axis direction. FIG. 19A illustrates not only each configuration example illustrated in FIG. 18 but also a structure example of a device above the configuration (in the Z-axis direction). In FIG. 19A, the n-type well NW is arranged above the p-type semiconductor substrate SUBp. On the principal surface of the semiconductor substrate, the $n^+$-type semiconductor region (power-feeding diffusion layer) N+(DFW) is formed in the NW. Moreover, on the principal surface of the semiconductor substrate, the buried insulating film (element isolation film) STI is formed in the NW, and the STI are formed so as to surround the N+(DFW) on the X-Y plane. The interlayer insulating film ISL1 is deposited on the principal surface of the semiconductor substrate, and the plurality of contact layers CT are formed in the ISL1. Each of one ends of the plurality of layers CT is connected to the N+(DFW) in the above-described NW. The first metal wiring layers M1 are formed on the ISL1, and the interlayer insulating film ISL2 is deposited on the M1. Each of the other ends of the plurality of layers CT is connected to the M1. The power-supply voltage VDD is supplied to the M1.

FIG. 19B illustrates a cross-sectional configuration example obtained by cutting the region of each diffusion layer and the region of the power-feeding diffusion layer extending in the Y-axis direction in FIG. 18 on a line in the X-axis direction. FIG. 19B illustrates not only each configuration example illustrated in FIG. 18 but also a structure example of a device above the configuration (in the Z-axis direction). In FIG. 19B, on the p-type semiconductor substrate SUBp, the p-type well PW, the n-type well NW, and the p-type well PW are sequentially arranged along the X-axis direction. On the principal surface of the semiconductor substrate, the $p^+$-type semiconductor region (power-feeding diffusion layer) P+(DFW) is formed in each PW, and the $n^+$-type semiconductor region (power-feeding diffusion layer) N+(DFW) is formed in the NW. Moreover, on the principal surface of the semiconductor substrate, the buried insulating film (element isolation film) STI is formed in the PW and the NW. The STI is formed so as to surround each of the P+(DFW) and the N+(DFW).

On the principal surface of the semiconductor substrate, the gate layer GT is formed above one PW and the NW via the gate insulating film GOX. There are channel regions of the MIS transistors below the GOX in the regions of the one PW and the NW, and the film STI is arranged in parts except for the channel regions. Similarly, the GT is formed above the other PW and the NW via the GOX. There are channel regions of the MIS transistors below the GOX in the region of the other PW and the NW, and the film STI is arranged in parts except for the channel regions.

Moreover, the interlayer insulating film ISL1 is deposited on the principal surface of the semiconductor substrate, and the plurality of (in this case, five) contact layers CT are formed in the ISL1. Among them, one ends of two contact layers CT are connected to the respective P+(DFW) in the above-described PW, one end of one contact layer CT is connected to the N+(DFW) in the above-described NW, and one ends of the remaining two contact layers CT are connected to the above-described two gate layers GT. The plurality of first metal wiring layers M1 are formed on the ISL1, and the interlayer insulating film IS12 is deposited on the ISL1 and the M1. The other ends of the five contact layers CT are appropriately connected to the plurality of layers M1. Among them, the ground power-supply voltage VSS is supplied to the M1 connected to the P+(DFW) via the CT, and the power-supply voltage VDD is supplied to the M1 connected to the N+(DFW) via the CT.

FIG. 20A illustrates a cross-sectional configuration example obtained by cutting the regions of the $n^+$-type source/drain diffusion layers and the region of the $n^+$-type power-feeding diffusion layer extending in the X-axis direction in FIG. 18 on a line in the Y-axis direction. FIG. 20A illustrates not only each configuration example illustrated in FIG. 18 but also a device structure example above the configuration (in the Z-axis direction). In FIG. 20A, on the p-type semiconductor substrate SUBp, the n-type well NW and the p-type well PW are arranged sequentially along the Y-axis direction. On the principal surface of the semiconductor substrate, the plurality of $n^+$-type semiconductor region (diffusion layer) N+(DF) serving as the source/drain regions is formed in the PW, and the $n^+$-type semiconductor region (power-feeding diffusion layer) N+(DFW) is formed in the NW. Moreover, on the principal surface of the semiconductor substrate, the buried insulating film (element isolation film) STI is formed in the PW and the NW. The films STI are formed so as to surround the N+(DFW) on the X-Y plane.

On the principal surface of the semiconductor substrate, the plurality of (here, two) gate layers GT are formed on the PW via the gate insulating film GOX. The plurality of N+(DF) serving as the above-described source/drain regions are arranged in the PW positioned on both sides so as to interpose each GT therebetween. Moreover, the STI surrounding the above-described N+(DFW) is arranged in the vicinity of the boundary between the NW and the PW on the principal surface of the semiconductor substrate, and, the dummy gate layer GT_DMY is arranged along the above-described two layers GT via the GOX and above this STI. As described above, the GT_DMY is arranged above the STI, and is not functioned as a gate of the MIS transistor.

The interlayer insulating film ISL1 is deposited on the principal surface of the semiconductor substrate, and the plurality of contact layers CT are formed in the ISL1. One ends of some of the plurality of layers CT are connected to the plurality of the respective N+(DF) serving as the source/drain regions in the above-described PW, and one end of the other is connected to the N+(DFW) in the NW. The plurality of first metal wiring layers M1 are formed on the ISL1, and the interlayer insulating film ISL2 is deposited on the ISL1 and the M1. The other ends of the plurality of layers CT are appropriately connected to the plurality of layers M1. Among them, the power-supply voltage VDD is supplied to the layer M1 connected to the N+(DFW) via the CT.

FIG. 20B illustrates a cross-sectional configuration example obtained by cutting the regions of the $p^+$-type source/drain diffusion layers and the region of the $n^+$-type power-feeding diffusion layer extending in the X-direction in FIG. 18 on a line in the Y-axis direction. FIG. 20B illustrates not only each configuration example illustrated in FIG. 18 but also a device structure example above the configuration (in the Z-axis direction). In FIG. 20B, the n-type well NW is arranged on the p-type semiconductor substrate SUBp. On the principal surface of the semiconductor substrate, the plurality of $p^+$-type semiconductor regions (diffusion layers) P+(DF) serving as the source/drain regions and the $n^+$-type semiconductor region (power-feeding diffusion layer) N+(DFW) are formed in the NW. Moreover, on the principal surface of the semiconductor substrate, the buried insulating film (element isolation film)

STI is formed in the NW. The films STI are formed so as to surround the N+(DFW) on the X-Y plane.

On the principal surface of the semiconductor substrate, the plurality of (here, two) gate layers GT are formed on the NW via the gate insulating film GOX. The plurality of P+(DF) serving as the above-described source/drain regions are arranged in the NW positioned on both sides so as to interpose each GT therebetween. Also, on the principal surface of the semiconductor substrate, the above-described STI surrounding the N+(DFW) are arranged between the N+(DFW) and the P+(DF) that is the closest to the N+(DFW), and the dummy gate layer GT_DMY is arranged along the above-described two gate layers GT via the GOX and above this STI. As described above, the GT_DMY is arranged above the STI, but is not functioned as the gate of the MIS transistor.

The interlayer insulating film ISL1 is deposited on the principal surface of the semiconductor substrate, and the plurality of contact layers CT are formed in the ISL1. One ends of some of the plurality of layers CT are connected to the above-described plurality of the respective P+(DF) serving as the source/drain regions in the NW, and one end of the other is connected to the N+(DFW) in the NW. The plurality of first metal wiring layers M1 are formed on the ISL1, and the interlayer insulating film ISL2 is deposited on the ISL1 and the M1. The other ends of the plurality of layers CT are appropriately connected to the plurality of layers M1. Among them, the power-supply voltage VDD is supplied to the M1 connected to the N+(DFW) via the CT.

As described above, by using the semiconductor device of the present second embodiment, typically, the semiconductor device having the layout with the high degree of freedom in accordance with the power feeding region extending in the X-axis direction can be achieved as similar to the case of the first embodiment. As a result, the area of the semiconductor device can be reduced. Moreover, manufacturing variations can be reduced by using the dummy gate layer, and besides, the efficiency of the power feeding region can be further improved in some cases by using the power feeding region extending in the Y-axis direction in addition to that in the X-axis direction.

Third Embodiment

<<Details of Well Power Feeding Method (Second Modification Example)>>

FIG. 21A is a plan view illustrating a configuration example of a well arrangement and a well power-feeding method of a semiconductor device according to the third embodiment of the present invention, and FIG. 21B is a plan view illustrating a comparative example of FIG. 21A. The semiconductor device as illustrated in FIG. 21A has such characteristics that the well power-feeding method as described with FIG. 13 is combined with the gate twice-patterning mask pattern GTRE. First, in the comparative example illustrated in FIG. 21B, as similar to the case of FIG. 15A, the PW and the NW are alternately arranged in the X-axis direction, a power feeding region extending in the X-axis direction and being joined to the NW is arranged on such one side as interposing the PW and the NW therebetween in the Y-axis direction, and a power feeding region extending in the X-axis direction and being joined to the PW is arranged on the other side. The power feeding region for the NW is provided with the NW extending in the X-axis direction and the n$^+$-type semiconductor region (power-feeding diffusion layer) N+(DFW) formed therein, and the power feeding region for the PW is provided with the PW extending in the X-axis direction and the p$^+$-type semiconductor region (power-feeding diffusion layer) P+(DFW) formed therein.

In the PW and the NW except for the power feeding region, a MIS transistor is appropriately formed. A gate layer GT of the MIS transistor extends in the X-axis direction as described with FIG. 15A. Moreover, n$^+$-type semiconductor regions (diffusion layers) N+(DF) serving as source/drain of the NMIS transistor are formed on both sides of the GT in the PW, and p$^+$-type semiconductor regions (diffusion layers) P+(DF) serving as source/drain of the PMIS transistor are formed on both sides of the GT in the NW. Here, the sizes of each PMIS transistor and each NMIS transistor are adjusted by gate widths thereof, and the gate widths correspond to the sizes of the N+(DF) and the P+(DF) in the X-axis direction.

As described with FIG. 15A, by using the power feeding region extending in the X-axis direction, variable ranges of the sizes of the gate widths are increased, so that the degree of freedom of the layout can be increased. However, in practice, as illustrated in FIG. 18B, such a pattern that an end of the gate layer GT can be rounded is provided by using a normal manufacturing process, and therefore, it is required to secure a distance (WW2) to some extent between the boundary of the diffusion layer (for example, N+(DF)) and the end of the GT. In this case, the variable ranges of the gate widths are reduced by the distance. Accordingly, by using the gate twice-patterning mask pattern GTRE as illustrated in FIG. 18A, a distance (WW1) between the diffusion layer (for example, N+(DF)) and the end of the GT can be smaller than that of the case of FIG. 18B, and therefore, the degree of freedom of the layout can be further increased.

<<Manufacturing Method of Semiconductor Device According to Present Third Embodiment>>

Figure 22:
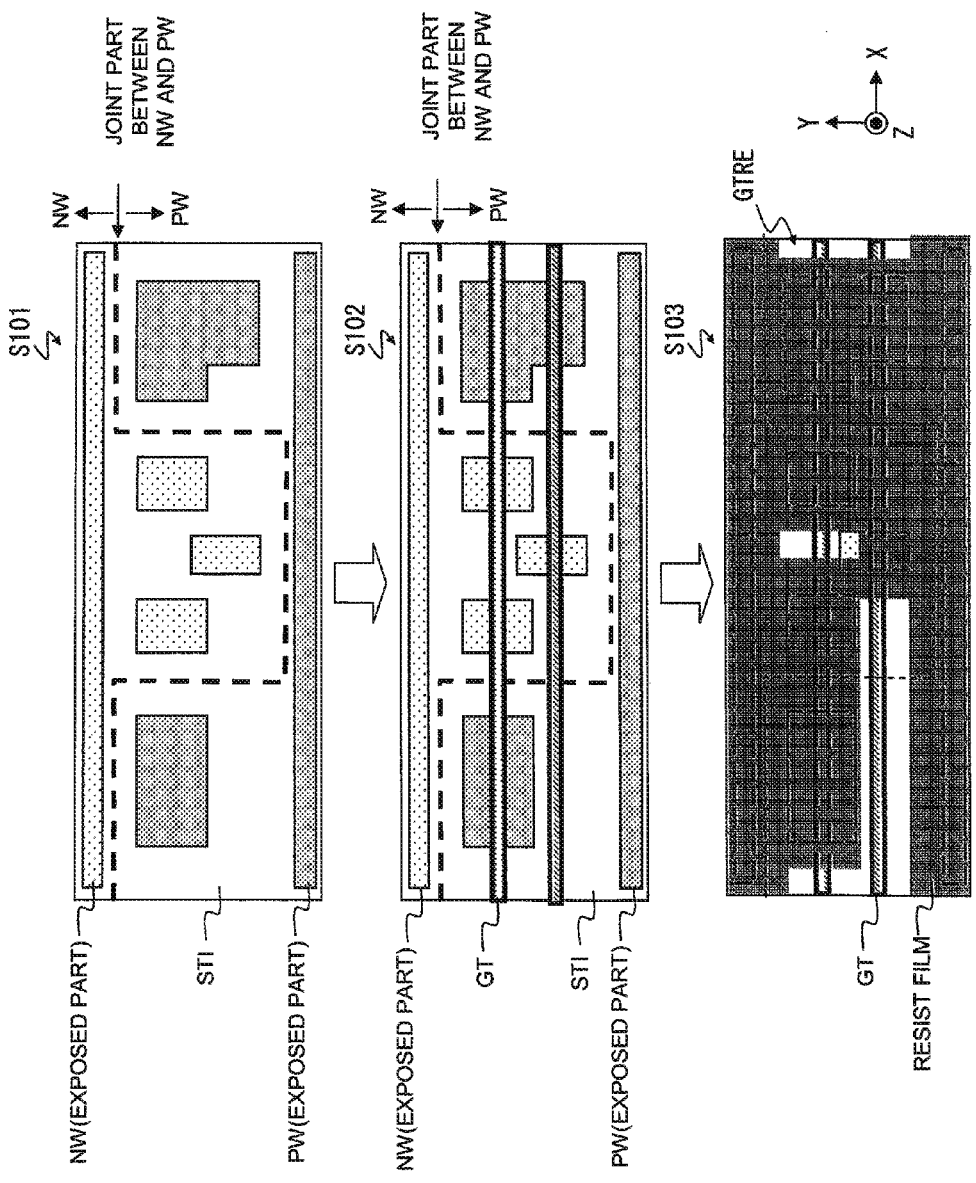
FIG. 22 is an explanatory diagram illustrating an example of a method of manufacturing the semiconductor device illustrated in FIG. 21A.
Figure 23:
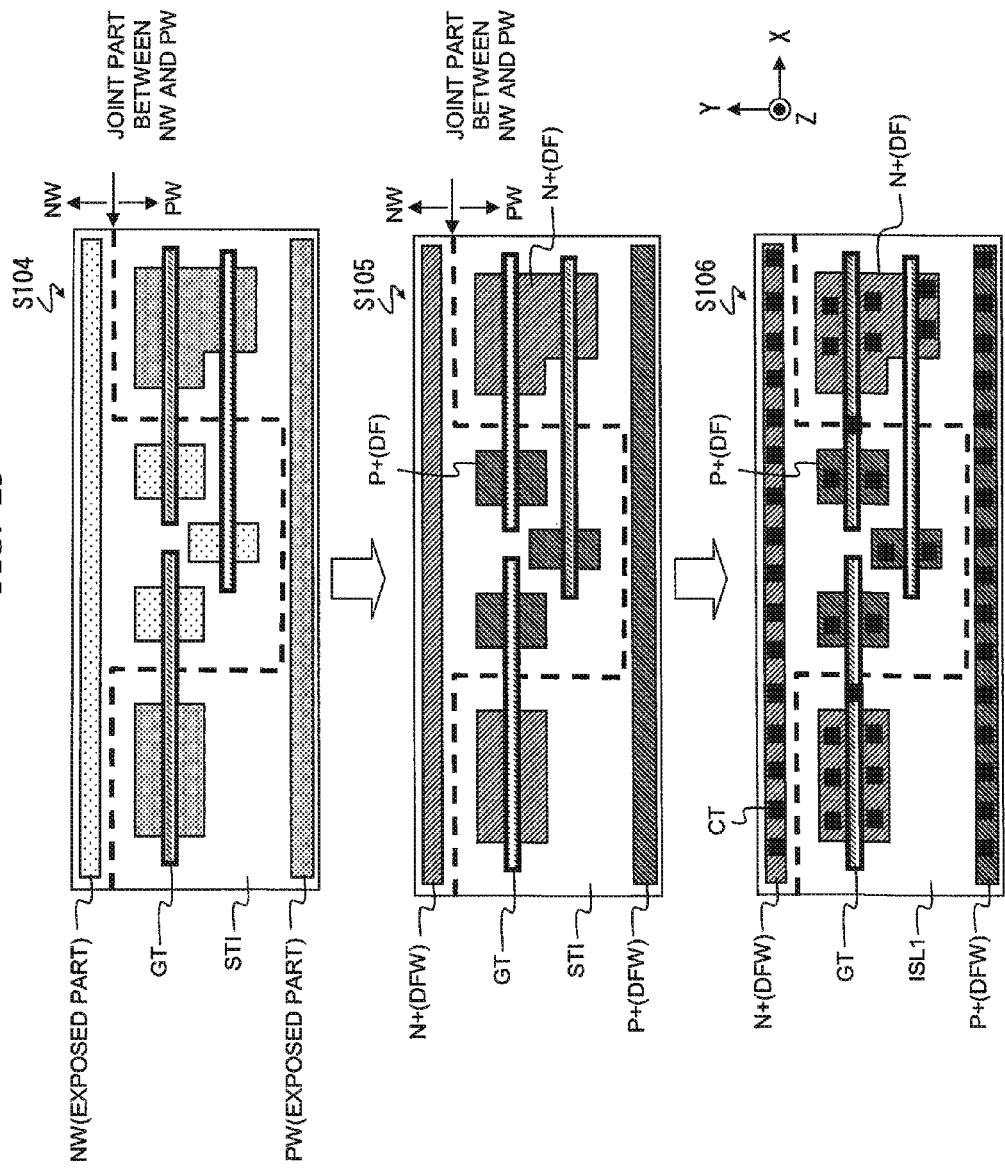
FIG. 23 is an explanatory diagram illustrating the example of the method of manufacturing the semiconductor device, continued from FIG. 22.

FIG. 22 is an explanatory diagram illustrating an example of a method of manufacturing the semiconductor device illustrated in FIG. 21A, and FIG. 23 is an explanatory diagram illustrating an example of the method of manufacturing the semiconductor device, continued from FIG. 22. In FIG. 22, in a step S101, first, the p-type well PW and the n-type well NW are formed on the semiconductor substrate (not illustrated), and the buried insulating film (element isolation film) STI is formed thereon except for a partial region of the PW (PW (exposed part)) and a partial region of the NW (NW (exposed part)). Then, in a step S102, the plurality of (here, two) gate layers GT serving as linear patterns which are along each other so as to extend in the X-axis direction are formed through a photolithography step (mask processing), etc. Note that, prior to the formation of the GT, the gate insulating film (not illustrated) is practically formed below the GT in the Z-axis direction. The gate insulating film is formed of a high dielectric film such as a hafnium-based film, and the gate layer GT is formed of a metal film (or a stacked film made of a plurality of metals) or others.

Subsequently, in a step S103, a resist film for partially exposing the GT is applied by a photolithography step (mask processing). At this time, the gate twice-patterned mask pattern GTRE as described above is used. Then, in a step S104 of FIG. 23, the GT is etched by using the resist film as a mask using a dry etching apparatus or others, and then, the resist film is removed. By this gate twice-patterning process, three linear GT can be generated from the above-described two linear GT, and besides, the distance between each GT and the boundary of the diffusion layer (at this stage, the PW (exposed part) or the NW (exposed part)) corresponding to the GT can be shortened as described above.

Subsequently, in a step S105 of FIG. 23, an impurity such as phosphorous (P) or arsenic (As) is implanted into the PW (exposed parts) positioned on both sides of the GT by using an ion implanting apparatus or others, and an impurity such as boron (B) is implanted into the NW (exposed parts) positioned on both sides of the GT. In this manner, the PW (exposed part) becomes the n$^+$-type semiconductor regions (diffusion layer) N+(DF) for the source/drain, and the NW (exposed part) becomes the p$^+$-type semiconductor region (diffusion layer) P+(DF) for the source/drain. Furthermore, by using an ion implanting apparatus or others, an impurity such as phosphorous (P) or arsenic (As) is implanted into the NW (exposed part) extending in the X-axis direction, and an impurity such as boron (B) is implanted into the PW (exposed part) extending in the X-axis direction. In this manner, the NW (exposed part) becomes the n$^+$-type semiconductor region (power-feeding diffusion layer) N+(DFW), and the PW (exposed part) becomes the p$^+$-type semiconductor region (power-feeding diffusion layer) P+(DFW).

Then, in a step S106, the interlayer insulating film ISL1 is deposited on the principal surface of the semiconductor substrate by using a plasma CVD apparatus or others, and then, the contact holes are formed in the ISL1 so as to target predetermined locations of the N+(DF), the P+(DF), the N+(DFW), the P+(DFW), and the GT by a photolithography step. Then, the contact layers CT each formed of a stacked film made of combination of, for example, titanium (Ti), titanium nitride, tungsten (W), etc. are buried in the contact holes. Here, note that the explanation has been made with the example using a method called a gate first method. However, a method called a gate last method can be also used.

If the gate last method is used, the gate layer, the source/drain diffusion layers (N+(DF), P+(DF)), and the interlayer insulating film ISL1 in a thickness direction are partially formed by using dummy polysilicon once, and then, the dummy polysilicon is removed, so that the gate layer (metal gate) GT formed of a metal film is buried in a trench which is partially opened in the ISL1. Alternatively, prior to the burying of the metal gate, the gate insulating film is also buried. That is, the procedure of the step S105 described with FIG. 23 (at this stage, in which the metal gate and the gate insulating film are formed) and the procedure of the step S102 described with FIG. 22 (at this stage, in which the formation of the gate insulating film is not necessary in some cases) are slightly changed.

As described above, by using the semiconductor device of the present third embodiment, typically, the semiconductor device having the layout with the further higher degree of freedom can be achieved compared with the case of the first embodiment. As a result, the area of the semiconductor device can be reduced. Note that the gate twice-patterning process described with FIGS. 22 and 23 can be performed in the same step as the gate twice-patterning process for the SRAM memory cell described with FIG. 5.

Fourth Embodiment

<<Well Arrangement Method of Entire Semiconductor Device>>

Figure 24A:
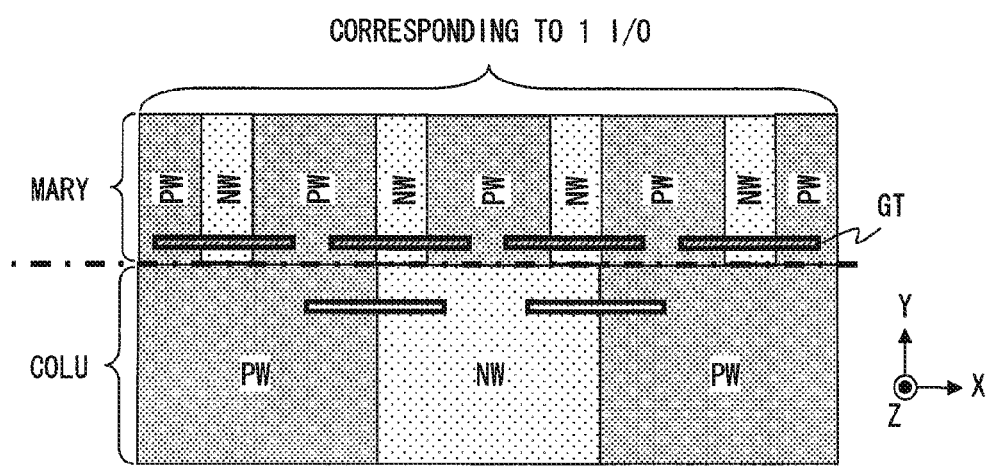
FIGS. 24A and 24B are a plan view illustrating an example of a basic concept of a well arrangement method in a semiconductor device according to the fourth embodiment of the present invention and a plan view illustrating a well arrangement method of a comparison example with FIG. 24A, respectively.
Figure 24B:
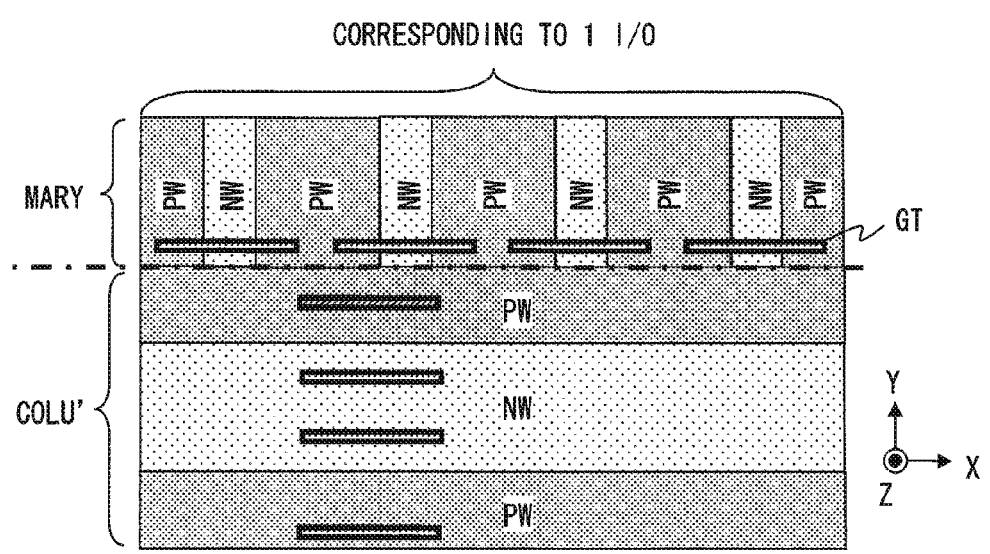

In the present fourth embodiment, an overall well arrangement method of the semiconductor device including various characteristics as described in the first to three embodiments will be explained. FIG. 24A is a plan view illustrating an example of a basic concept of a well arrangement method of a semiconductor device according to the fourth embodiment of the present invention, and FIG. 24B is a plan view illustrating a well arrangement method of a comparative example of FIG. 24A. In FIGS. 24A and 24B, a memory array MARY as illustrated in FIG. 7 and a column control unit COLU (COLU') which transmits/receives a signal to/from a plurality of bit-line pairs in the MARY are arranged sequentially in the Y-axis direction.

Figures 26A, 26B, 26C:
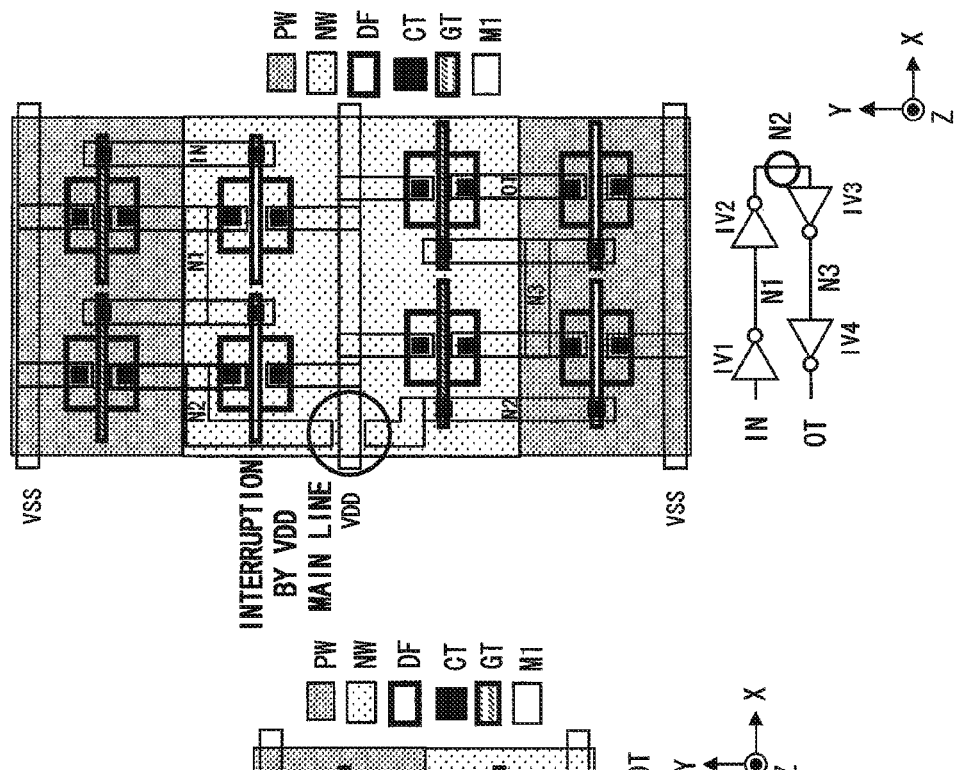
FIG. 26A to FIG. 26C are explanatory diagrams illustrating examples of problems in a case of usage of the well arrangement method of FIG. 24B.

As described above, if the manufacturing process having the minimum processing size of 28 nm or smaller is particularly used, it is desired to uniform the extending directions of the gate layers in the same direction as each other in the entire semiconductor device in order to maintain the sufficient processing accuracy. In this case, as illustrated in FIG. 24B of the comparative example, if the COLU' uses a well arrangement method with a horizontal-stripe structure in which the p-type well and the n-type well NW are alternately arranged in the Y-axis direction so that a boundary line between the PW and the NW extends in the X-axis direction, the degree of freedom of the layout is reduced, and, as a result, there is a risk of difficulty of the reduction of the area of the semiconductor device. FIGS. 26A to 26C are explanatory diagrams illustrating one example of a problem in a case in which the well arrangement method of FIG. 24B is used.

FIGS. 26A and 26B illustrate a layout configuration example with two-stage-connected CMIS-type inverter circuits IV1 and IV2 each of which is different from each other. In FIG. 26A, the power-supply wires (VDD, VSS) each formed of the first meal wiring layer M1 extend in the Y-axis direction. In FIG. 26B, power-supply wires (VDD, VSS) formed of the M1 extend in the X-axis direction. Here, it is assumed that the number of stages of the CMIS-type inverter circuit is further increased. If the layout of FIG. 26A is used, when a signal from an output node OT (here, M1) of the IV2 which is in the latter stage is transmitted to a next stage, the number increase in the X-axis direction is interrupted by the power-supply wire (here, VDD), and the number increase in the Y-axis direction is also interrupted by a wires (wire (M1) extending in the X-axis direction) which connects the power-supply wires (VDD, VSS) and a source node of each MIS transistor.

On the other hand, if the layout of FIG. 26B is used, when a signal from an output node OT (here, M1) of the IV2 which is in the latter stage is transmitted to a next step, while the number increase in the X-axis direction has no particular interruption, the number increase in the Y-axis direction is interrupted by the power-supply wire (here, VDD) as illustrated in FIG. 26C. Particularly, the size of the column control unit COLU' in the X-axis direction or others is limited by the MARY, and therefore, it is more desired to transmit the signal in the Y-axis direction rather than transmit in the X-axis direction. Therefore, if the layouts as illustrated in FIGS. 26A and 26B are used, when the number of stages of the CMIS-type inverter circuit is increased as described above, it is required to use an upper-layer wire (second metal wiring layer) of the M1, and therefore, the degree of freedom of the layout is reduced, which results in the difficulty of the reduction of the area of the semiconductor device.

Figure 25A:
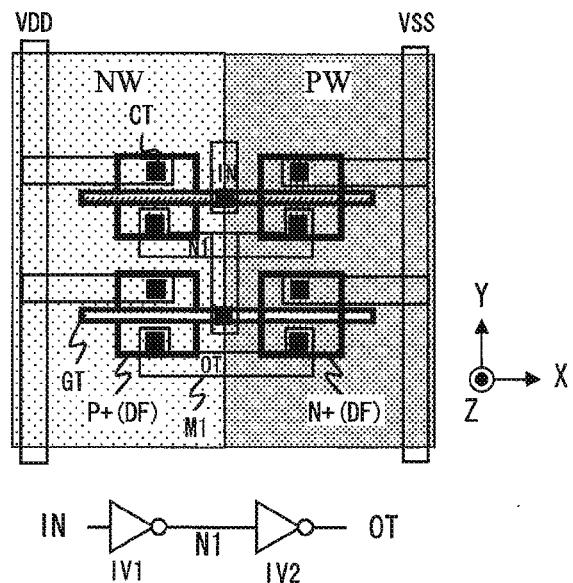
FIG. 25A and FIG. 25B are explanatory diagrams illustrating examples of effects in a case of usage of the well arrangement method of FIG. 24A.
Figure 25B:
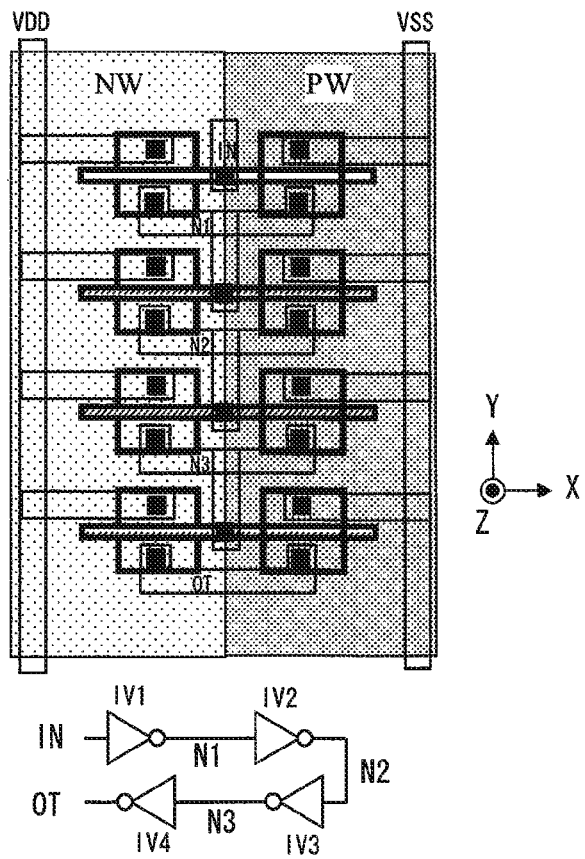

Accordingly, it is beneficial to use the well arrangement method as illustrated in FIG. 24A. In FIG. 24A, the COLU uses a well arrangement method with a vertical-stripe structure in which the p-type well PW and the n-type well NW are arranged to be alternately aligined in the X-axis direction so that a boundary line between the PW and the NW extends in the Y-axis direction. FIGS. 25A and 25B are explanatory diagrams illustrating one example of an effect in a case in which the well arrangement method of FIG. 24A is used.

FIG. 25A illustrates a layout configuration example of two-stage-connected CMIS-type inverter circuits IV1 and IV2, and FIG. 25B illustrates a layout configuration example of four-stage-connected CMIS-type inverter circuits IV1 to IV4.

In FIGS. 25A and 25B, the power-supply wires (VDD, VSS) each formed of the first metal wiring layer M1 extend in the Y-axis direction, and the IV1 to the IV4 are sequentially arranged in the Y-axis direction. As described above, if the well arrangement method of FIG. 24A is used, when the number of stages of the CMIS-type inverter circuits is increased, it is not required to use the upper-layer wire of the M1 (second metal wiring layer), and this can be achieved with the wires up to the M1. Furthermore, by arranging each gate layer GT so as to cross the boundary between the NW and the PW and so as to use the gate layer as a common gate between the PMIS transistor and the NMIS transistor, each CMIS-type inverter circuit can be achieved with higher area efficiency as illustrated in FIGS. 26A to 26C than that in a case in which the gate layers of the PMIS transistor and the NMIS transistor are individually provided. As a result of them, the degree of freedom of the layout is improved, which results in the achievement of the reduction of the area of the semiconductor device.

<<Well Arrangement Method of Column Control Circuit Block>>

Figure 27:
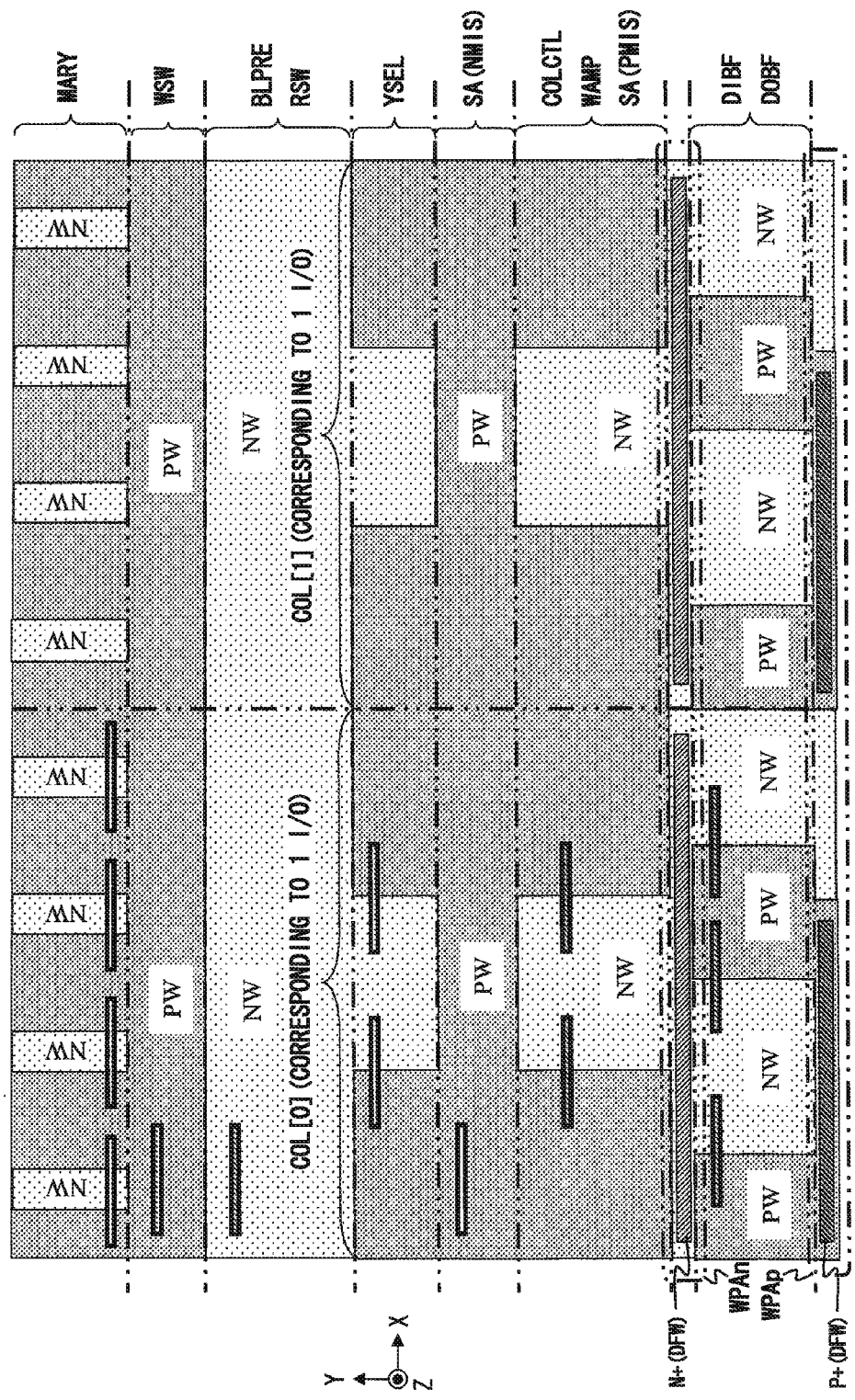
FIG. 27 is a plan view illustrating a configuration example of outline well arrangement in the column control circuit block of FIGS. 8 and 9.

FIG. 27 is a plan view illustrating a configuration example of outline well arrangement of the column control circuit block of FIGS. 8 and 9 in the semiconductor device according to the fourth embodiment of the present invention. The configuration example of FIG. 27 is almost similar to the above-described configuration example of FIG. 10, and mainly defines the arrangement method of the gate layer GT for the configuration example of FIG. 10. Moreover, in the configuration example of FIG. 27, partial illustration of the power feeding region (power feeding region extending in the Y-axis direction) in the configuration example of FIG. 10 is omitted. As illustrated in FIG. 27, in the column control circuit block, the well arrangement with the above-described vertical-stripe structure is used for the gate layer GT extending in the X-axis direction as much as possible. And, in order to further improve the degree of freedom of the layout for the well arrangement with this vertical-stripe structure, it is beneficial to provide the power feeding regions (WPAn and WPAp of FIG. 27) extending in the X-axis direction as described in the above-described embodiments.

<<Well Arrangement and Well Power Feeding Method of Word-Line Drive Circuit Block>>

FIG. 28A is a plan view illustrating an outline layout configuration example regarding well arrangement and well power feeding of the word-line drive circuit block of FIG. 3 in the semiconductor device according to the fourth embodiment of the present invention, and FIG. 28B is a cross-sectional view illustrating an outline device structure example of a part between I-I' in FIG. 28A. In the word-line drive circuit block WLDBK illustrated in FIG. 28A, the plurality of p-type wells PW and the plurality of n-type wells NW are alternately arranged sequentially along the X-axis direction. On each well, the gate layer GT crossing the boundary between the PW and the NW and extending in the X-axis direction is appropriately arranged. Moreover, the $p^+$-type semiconductor region (power-feeding diffusion layer) P+(DFW) extending in the Y-axis direction is arranged in each PW, and the $n^+$-type semiconductor region (power-feeding diffusion layer) N+(DFW) extending in the Y-axis direction is arranged in each NW.

FIG. 28B illustrates not only the well and the power feeding part of the well which is illustrated in FIG. 28A but also a device structure above the well (in the Z-axis direction). In FIG. 28B, on the p-type semiconductor substrate SUBp, the PW and the NW are alternately continuously arranged along the X-axis direction. On the principal surface of the semiconductor substrate, each P+(DFW) is formed in each PW, and each N+(DFW) is formed in each NW. Moreover, on the principal surface of the semiconductor substrate, the buried insulating film (element isolation film) STI is formed in the PW and the NW, and the films STI are formed so as to surround each of the N+(DFW) and the P+(DFW) on the X-Y plane.

The interlayer insulating film ISL1 is deposited on the principal surface of the semiconductor substrate, and the plurality of contact layers CT are formed in the ISL1. One ends of some of the plurality of layers CT are connected to the P+(DFW) in the respective PW, and one ends of the others of the plurality of layers CT are connected to the N+(DFW) in the respective NW. The first metal wiring layer M1 is formed on the ISL1, and the interlayer insulating film ISL2 is deposited on the ISL1 and the M1. The second metal wiring layer M2 is formed on the ISL2, and the interlayer insulating film ISL3 is deposited on the ISL2 and the M2. The third metal wiring layer M3 is formed on the ISL3. Moreover, the first via layer V1 for connecting the M1 and the M2 is formed in the ISL2, and the second via layer V2 for connecting the M2 and the M3 is formed in the ISL3.

Here, the other end of each CT whose one end is connected to the above-described P+(DFW) in each PW is connected to the M3 sequentially via the M1, the V1, the M2, and the V2. The M3 is of one wire extending in the X-axis direction here, and the above-described P+(DFW) in each PW is commonly connected to the M3. The ground power-supply voltage VSS is supplied to the M3. On the other hand, the other end of each CT whose one end is connected to the above-described N+(DFW) in each NW is connected to the M2 sequentially via the M1 and the V1. The layer M2 is of a plurality of wires which are along each other so as to extend in the Y-axis direction. However, the plurality of layers M2 are commonly connected in a region which is not illustrated. The power-supply voltage VDD is supplied to the layer M2.

<<Well Arrangement and Power Feeding Method of Total Control Circuit Block>>

FIG. 29A is a plan view illustrating an outline layout configuration example regarding well arrangement and well power feeding of the total control circuit block of FIG. 3 in the semiconductor device according to the fourth embodiment of the present invention, and FIG. 29B is a cross-sectional view illustrating an outline device structure example of a part between J-J' in FIG. 29A. As similar to the case of FIG. 28A, also in the total control circuit block CTLBK illustrated in FIG. 29A, the plurality of p-type wells PW and the plurality of n-type wells NW are alternately arranged sequentially along the X-axis direction. On each well, the gate layer GT crossing the boundary between the PW and the NW and extending in the X-axis direction is appropriately arranged. Moreover, the $p^+$-type semiconductor region (power-feeding diffusion layer) P+(DFW) extending in the Y-axis direction is arranged in each PW, and the $n^+$-type semiconductor region (power-feeding diffusion layer) N+(DFW) extending in the Y-axis direction is arranged in each NW. FIG. 29B illustrates not only the well and the power feeding part of the well which is illustrated in FIG. 29A but also a device structure above the well (in the Z-axis direction). In the device structure example of FIG.

29B, the number of the alternately-arranged wells is different from that of the above-described device structure example of FIG. 28B. However, the basic structure except for the number is similar to that of the case of FIG. 11.

As described above, the well arrangement with the vertical-stripe structure as described with FIG. 24A is used in the word-line drive circuit block WLDBK and the total control circuit block CTLBK, so that the efficient layout is achieved. However, since the sizes of the respective wells in the Y-axis direction in the blocks can be increased, the power feeding region (power-feeding diffusion layer) extending in the Y-axis direction is used here.

In the foregoing, the invention made by the inventors has been concretely described based on the embodiments. However, it is needless to say that the present invention is not limited to the foregoing embodiments and various modifications and alterations can be made within the scope of the present invention.

For example, the above-described embodiments described here have been explained by exemplifying the SRAM as the memory unit. However, as a matter of course, the present invention can be similarly applied also to various volatile memories represented by a DRAM (Dynamic Random Access Memory) and various non-volatile memories represented by a flash memory. Moreover, the explanation has been made by exemplifying the semiconductor device such as an SOC equipped with the memory unit. However, the present invention can be similarly applied also to a semiconductor storage device configured of a single memory unit, and can be also applied to a logic semiconductor device not equipped with the memory unit depending on a case.

INDUSTRIAL APPLICABILITY

The semiconductor devices according to the present embodiments are particularly beneficial in application to an LSI such as an SOC equipped with a memory unit such as an SRAM, but not limited thereto, and can be widely applied to general LSIs.

SYMBOL EXPLANATION

ADRDEC address decode circuit
APPU application unit
AR, ARN, ARP part
BBU baseband unit
BL, ZBL bit line
BLPRE bit-line precharge circuit
CCN cache controller
COL column circuit
COLBK column control circuit block
COLCTL column control circuit
COLU, COLU' column control unit
CPU processor unit
CT contact layer
CTLBK total control circuit block
DF semiconductor region (diffusion layer)
DIBF input buffer circuit
DOBF output buffer circuit
Din data input signal
Dout data output signal
FF latch circuit
GOX gate insulating film
GT gate layer
GT_DMY dummy gate layer
GTRE gate twice-patterned mask pattern
IOU input/output unit
ISL interlayer insulating film
IV CMIS-type inverter circuit
M1 first metal wiring layer
M2 second metal wiring layer
M3 third metal wiring layer
MARY memory array
MC memory cell
MEMU memory unit
MN NMIS transistor
MP PMIS transistor
N+(DF) $n^+$-type semiconductor region (diffusion layer)
N+(DFW) $n^+$-type semiconductor region (power-feeding diffusion layer)
NW n-type well
P+(DF) $p^+$-type semiconductor region (diffusion layer)
P+(DFW) $p^+$-type semiconductor region (power-feeding diffusion layer)
PW p-type well
REP replica circuit
RSW reading switch circuit
SA sense amplifier circuit
SAPRE sense-amplifier prechrage circuit
STI buried insulating film (element isolation film)
SUBp semiconductor substrate
V1 first via layer
V2 second via layer
VDD power-supply voltage
VSS ground power-supply voltage
WAMP writing amplifier circuit
WL word line
WLDBK word-line drive circuit block
WPA power feeding region
WSW writing switch circuit
YSEL column selecting circuit

The invention claimed is:

1. A method of manufacturing a semiconductor device comprising the steps of:
   (a) forming a second well region of a second conductivity type including a fourth part on a semiconductor substrate;
   (b) on the semiconductor substrate, forming a first well region of a first conductivity type including a first part and a second part arranged to be adjacent to both sides of the fourth part in a first direction and a third part joined to the first part and the second part in a second direction intersecting with the first direction and arranged to be adjacent to the fourth part;
   (c) forming a first insulating film at a place on the first well region and the second well region except for a first source/drain pattern to be a partial region of the fourth part, a second source/drain pattern to be a partial region of the first part or the second part, and a power feeding pattern to be a partial region of the third part having a substantially-rectangular shape whose size in the first direction is larger than a size thereof in the second direction;
   (d) forming a gate layer having a linear shape and extending in the first direction so as to cross above the first source/drain pattern and above the second source/drain pattern;
   (e) partially etching the gate layer through mask process; and
   (f) introducing an impurity of the first conductivity type to the first source/drain pattern, introducing an impurity of the second conductivity type to the second source/drain pattern, and introducing an impurity of the first conductivity type to the power feeding pattern.

2. The method of manufacturing the semiconductor device according to claim 1,
wherein the power feeding pattern includes a zone arranged to be opposed to the fourth part in the second direction.

3. The method of manufacturing the semiconductor device according to claim 1,
wherein the gate layer is mounted on the first source/drain pattern and the second source/drain pattern via a gate insulating film,
the gate insulating film has a higher dielectric constant than a dielectric constant of silicon dioxide, and
the gate layer is formed of a metal film.

\* \* \* \* \*